(12) United States Patent
Alexander et al.

(10) Patent No.: US 6,229,536 B1
(45) Date of Patent: *May 8, 2001

(54) SYSTEM AND METHOD FOR DISPLAYING SIMULTANEOUSLY A MAIN WAVEFORM DISPLAY AND A MAGNIFIED WAVEFORM DISPLAY IN A SIGNAL MEASUREMENT SYSTEM

(75) Inventors: Jay A. Alexander, Monument; Angelica L. Sostheim, Colorado Springs, both of CO (US)

(73) Assignee: Agilent Technologies, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/035,561

(22) Filed: Mar. 5, 1998

(51) Int. Cl.$^7$ ........................................ G06F 3/00
(52) U.S. Cl. .................... 345/340; 345/134; 345/342; 345/346; 345/440
(58) Field of Search .................... 345/440, 342, 345/344, 345, 346, 343, 970, 439, 134

(56) References Cited

U.S. PATENT DOCUMENTS

| | | | |
|---|---|---|---|
| 5,129,722 | * 7/1992 | Mader et al. ........................ | 356/73.1 |
| 5,187,776 | * 2/1993 | Yanker .................................. | 345/341 |
| 5,254,983 | * 10/1993 | Long et al. .......................... | 345/147 |
| 5,323,173 | * 6/1994 | Sakuma et al. ...................... | 345/131 |
| 5,491,781 | * 2/1996 | Gasperina ............................ | 345/341 |
| 5,517,105 | * 5/1996 | Holzwarth ........................ | 324/121 R |
| 5,579,462 | * 11/1996 | Barber et al. ........................ | 345/440 |

* cited by examiner

Primary Examiner—Raymond J. Bayerl
Assistant Examiner—Chong T. Thai

(57) ABSTRACT

An apparatus and methodology for use in a signal measurement system having a graphical user interface. The apparatus constructed and arranged to simultaneously render on a display of pixels a main waveform display and a magnified waveform display is disclosed. The main waveform display is adapted to have displayed therein one or more waveforms and associated data on a first graticule with a background while the magnified waveform display is adapted to have displayed therein a magnified view of a region of the main waveform display on a second graticule with a background. The region of the main waveform display to be magnified is defined by a graphically-controllable selection window positioned over the main waveform display to encompass the region. Preferably, the operator-controllable selection window has a position and extent that may be graphically manipulated.

55 Claims, 12 Drawing Sheets

SYSTEM AND METHOD FOR DISPLAYING SIMULTANEOUSLY A MAIN WAVEFORM DISPLAY AND A MAGNIFIED WAVEFORM DISPLAY IN A SIGNAL MEASUREMENT SYSTEM

BACKGROUND OF THE INVENTION

1. Field of the Invention

The present invention relates generally to signal measurement systems and, more particularly, providing a magnified view of displayed waveforms in signal measurement systems.

2. Related Art

Conventional signal measurement systems such as digital oscilloscopes sample, record and display time-varying analog signals. Samples of an input signal are taken and quantified, and the resultant digital representations are stored in a waveform memory under the control of a sampling clock. The acquired data may subsequently be read out as locations in memory are sequentially addressed by a clock signal to provide digital data which can be converted to a time-varying output signal for a waveform display. The sampling clock may be operated at one of several selectable rates depending upon the frequency content of the input signal. The selection of the portion of the analog input signal which is sampled and stored is determined by appropriate triggering circuitry to enable the operator to display the desired portion of the waveform.

There are many types of display elements which can be presented in signal measurement systems in general and test and measurement instruments in particular. For example, in addition to waveforms representing the signals currently received at channel inputs, waveforms referred to as function waveforms may also be displayed. Function waveforms are waveforms created by processing the signal waveforms. Function waveforms may be created, for example, by performing arithmetic manipulations or combining multiple input signal waveforms. The resulting function waveforms are placed in a system memory for subsequent retrieval and display. In addition, memory waveforms may also be displayed. Memory waveforms are waveforms which have been stored in memory for later display. In addition to the above waveforms, other well-known display elements such as marker indicators, trigger indicators, etc. are typically available for display.

Conventional test and measurement systems typically provide a display grid commonly referred to as a graticule on which the display elements are presented. The display grid divides the coordinate axes into a series of divisions. Waveforms are displayed on the graticule and are scaled vertically and horizontally to facilitate analysis. Typically, the horizontal scale represents sweep speed and is in units of seconds per division. The vertical scale represents signal amplitude and is in units of volts per division. The center of the horizontal axis represents the delay or horizontal position of the displayed waveforms and is referred to herein as horizontal offset. The center of the vertical axis represents the displayed reference voltage of the displayed waveforms and is referred to herein as vertical offset. These parameters are generally referred to as scaling parameters. Thus, there are four scaling parameters which are controlled by the operator to capture a desired portion of a waveform and to achieve a desired relative display of multiple waveforms: horizontal scale, horizontal offset, vertical scale and vertical offset.

A primary function provided of signal measurement systems in the analysis of signals is to enable an operator to magnify the displayed waveforms. Magnified views of desired regions of displayed waveforms allow an operator to easily and accurately determine relative values between the displayed waveforms. Magnified views are also a useful and productive technique for displaying details of a displayed waveform to better understand the behavior of the waveform and its correlation with measured quantities such as peak-to-peak voltage, rise-time, etc. Generally, signal measurement systems display simultaneously two views of a displayed waveform when the operator selects the magnification feature: the original or main waveform display, and the magnified waveform display. When the magnification function is invoked, the main waveform display is typically allocated a portion of the display screen while the magnified waveform display is drawn in the portion of the display screen not occupied by the main waveform display. The magnified waveform display presents a predetermined or selected portion or region of the main waveform display at some expanded scale.

In one conventional approach to providing a magnified view of waveform displays, the waveforms in the selected portion of the main waveform display are rendered in a unique color, commonly dark red. This technique derives from that used in monochrome analog oscilloscopes which used a higher intensity shade for signal waveforms in the selected waveform region. There are a number of drawbacks to such conventional systems. First, when the color of the waveforms is replaced with the selected intensified color, the informational content of the waveform display embodied in the waveform color is lost. Furthermore, it is difficult to distinguish between multiple waveforms rendered in the same intensified color. Also, changing colors of the selected region is not necessarily sufficient to identify the selected portion of the waveforms. This may occur, for example, when the magnified scale is very small relative to the main scale or when the displayed waveforms are very sparse. In such situations there may be an extremely small region rendered in the intensified trace which may be difficult or impossible for an operator to see.

Another conventional approach to providing a magnified view requires the operator to delineate the region of the main view which is to be magnified using vertical markers. This conventional technique is commonly used in monochrome oscilloscopes where the implementation of an intensified trace using different colors or shades is difficult or impossible. This approach, however, is also subject to significant drawbacks. When a large amount of waveform information is presented in the main waveform display, the vertical markers may be indistinguishable from the displayed waveforms and associated information. A large amount of waveform information may be displayed, for example, when running in an untriggered state or when using infinite persistence with multi-valued waveforms. As a result, the extent of the waveform display which is being magnified cannot be easily identified in the main waveform display. This significantly reduces the utility of the magnified waveform display.

What is needed, therefore, is a system and method for generating a magnified view of a waveform display which is graphically associated with a selected region of the main view without compromising the information presented in either view. The system should also provide the operator with the ability to directly control the extent and position of the selected region of the waveform display to be magnified. Such a system should also be simple and uncomplicated to enable an operator to perform magnification operations on displayed waveforms quickly and easily.

SUMMARY OF THE INVENTION

The present invention is an apparatus and methodology for use in a signal measurement system having a graphical user interface. In one aspect of the invention, an apparatus constructed and arranged to simultaneously render on a display of pixels a main waveform display and a magnified waveform display is disclosed. The main waveform display is adapted to have displayed therein one or more waveforms and associated data on a first graticule with a background while the magnified waveform display is adapted to have displayed therein a magnified view of a region of the main waveform display on a second graticule with a background. The region of the main waveform display to be magnified is defined by a graphically-controllable selection window positioned over the main waveform display to encompass the region. Preferably, the operator-controllable selection window has a position and extent that may be graphically manipulated.

In one embodiment, the apparatus includes a magnification selection window determinator constructed and arranged to determine horizontal and vertical scale and offset values of the magnified waveform display. These values are related to a position and extent of the selection window. In this embodiment, the apparatus also includes a rendering controller constructed and arranged to control a rendering of the main waveform display, the magnification waveform display and the selection window based upon the horizontal and vertical scale and offset values. In one embodiment, the rendering controller is further constructed and arranged to control the rendering of the main waveform display, the magnification waveform display, and the selection window based upon a graphical mode of the display of pixels. Preferably, the rendering controller is still further constructed and arranged to control rendering of graphical features that associate the magnified waveform display and the selected region.

In one embodiment, the magnification selection window determinator includes a selection window boundary determinator for determining pixel boundaries of the selection window on the display. It also includes a graphical selector for enabling an operator to graphically manipulate the selection window to effect changes in scale and offset values of the magnified waveform display. Preferably, the graphical selector includes a selection window manipulation controller for determining whether the operator has graphically selected the selection window for changing its position or extent, and a hit-tester for determining whether a display element has been graphically selected.

In one alternative embodiment, the selection window manipulation controller determines whether a pixel within a predetermined region of pixels surrounding the selection window has been selected. Selection of a pixel within the predetermined region of pixels is interpreted as a rescaling operation such that subsequent changes in a cursor position result in analogous changes in a display location of only one or more of the plurality of selection window sides associated with the selected pixel. Selection of a pixel within the selection window and not within the predetermined region of pixels is interpreted as an offset adjustment operation such that subsequent changes in a cursor position result in analogous changes in location of all of the plurality of selection window sides. Alternatively, "resizing handles" may be used to distinguish whether a pixel on or adjacent to the selection window has been selected with the intent of changing the window's size or position.

In one further embodiment of this aspect of the invention, the rendering controller includes a windows rendering unit and a graticule rendering unit. The windows rendering unit is configured to generate commands to the graphical user interface to generate windows-related displays based upon the selection window boundaries as well as locations and sizes of the main and magnified waveform graticules. The graticule rendering unit is configured to generate commands to cause a rendering of the main and magnified waveform graticules and associated backgrounds based upon the locations and sizes of the graticules. Preferably, the windows rendering unit generates commands for receipt by the graphical user interface to render the selection window and one or more graphical features that visually associate the magnified waveform display and the selected region of the main waveform display.

In one preferred embodiment, the graticule rendering unit graphically associates the magnified waveform display and the selected display region by generating data to cause a rendering of a background region within the selection region in a first color, the background of the magnification waveform display in the same first color, and the background region of the main waveform display not within the selection window in a second color not the same as the first color.

In another aspect of the invention, an apparatus for use in a signal measurement system having a graphical user interface is disclosed. The apparatus is constructed and arranged to simultaneously display a main waveform display having displayed therein one or more displayed waveforms on a main waveform graticule, and a magnified waveform display having displayed therein a magnified view of a region of the main waveform display rendered on a magnified waveform graticule. The region is encompassed within a selection window positioned over the main waveform display so as to surround the region. The magnified waveform display and the selection window are graphically associated with each other. Preferably, the selection window is rendered on top of the main waveform display so as to surround the selected region, thereby not substantially interfering with information displayed on the main waveform display within the selection window.

In one embodiment, the main waveform display includes a first background region included within the selection window that is rendered in a first color. The magnified waveform display includes a second background region rendered in a second color substantially the same as the first color. The main window also includes a third background region external to the selection window that is rendered in a third color substantially different than the first and second colors.

In another aspect of the invention, a signal measurement system such as a digital oscilloscope is disclosed. The signal measurement system includes a display unit and a graphical user interface for controlling the display unit to provide a pixel display. The signal measurement system also includes a waveform magnification system constructed and arranged to simultaneously display a main waveform display having displayed therein one or more displayed waveforms on a main waveform graticule, and a magnified waveform display having displayed therein a magnified view of a selected region of the main waveform display rendered on a magnified waveform graticule. The selected region is encompassed within a graphically-controllable selection window positioned over the main waveform display so as to surround the selected region while not substantially interfering with information displayed on the main waveform display. Importantly, the magnified waveform display and the selection window are graphically associated with each other.

In a still further aspect of the invention, a method for magnifing a selected region of a main waveform display in a signal measuring system having a display device and a graphical user interface that controls a waveform display region on the display device is disclosed. The method includes the steps of: (a) displaying a main waveform display and a magnified waveform display, wherein the main waveform display includes a first graticule and the magnified waveform display includes a second graticule; (b) calculating a selection window surrounding the selected region of the main waveform display based upon horizontal and vertical scale and offset settings for the main waveform display and the magnified waveform display, and a size and location of the first and second graticules; and (c) graphically associating the magnified waveform display and the selected region of the main waveform display.

In one embodiment, step (a) includes the steps of: (1) rendering the first and second graticules on the waveform display region; and (2) rendering a main view supporting window and a magnified view supporting window. The first and second graticules have a size based upon a current graphical mode of the waveform display region. Also, the main view supporting window and the magnified view supporting window each preferably include display elements associated with control and display of information provided in the associated waveform displays.

In one particular embodiment, step (b) includes the steps of: (1) determining scale and offset settings for the main waveform display and the magnified waveform display; (2) determining main and magnified window display ranges and the scale and offset values based upon the scale and offset settings and a graphical mode of the waveform display region; (3) determining boundaries of the selection window; and (4) rendering the selection window.

In another embodiment, step (c) includes the steps of: (1) rendering a background of the main waveform graticules within the selection window in a first color; (2) rendering a main waveform background not within the selection window in a second color not substantially the same as the first color; and (3) rendering a background of the magnified view window in the first color. Preferably, the second color is chosen such that the contrast between the main waveform background and waveforms rendered in the main waveform display is reduced from that of the selection window.

Advantageously, the present invention enables an operator to directly interact with the displayed waveforms to select a desired waveform display region for magnified viewing. Furthermore, the graphical techniques of the present invention enable an operator to select the scale (extent) and offset (position) of the magnified view quickly and easily. Thus, a graphical approach for directly interacting with the displayed waveforms to select a desired waveform display region for magnification is provided.

Another advantage of the present invention is that the graphical association of the selected waveform region and the magnified waveform display assists the operator in visually correlating the informational content of the main and magnified views of the selected waveform region. This also clearly communicates the relationship between the contents of the main and magnified view windows while retaining all of the information contained in the main waveform display. Thus, an operator may observe all information provided by the implementing system related to the displayed waveforms while simultaneously observing a magnified view of a selected portion of the displayed waveform.

Another advantage of the present invention is that the selection window may be positioned by the operator so as to encompass any desired region of the main waveform display while not degrading or interfering with the informational content present on the main waveform display.

A still further advantage is that the present invention utilizes graphical features to identify the selected region, preserving the separate waveform colors throughout the main waveform display. Furthermore, the selection window is rendered so as to appear on top of the waveform display, making the selected region apparent even when waveform data occupies the entire selected region.

Further features and advantages of the present invention as well as the structure and operation of various embodiments of the present invention are described in detail below with reference to the accompanying drawings.

BRIEF DESCRIPTION OF THE DRAWINGS

This invention is pointed out with particularity in the appended claims. The above and further advantages of this invention may be better understood by referring to the following description taken in conjunction with the accompanying drawings. In the drawings, like reference numerals indicate identical or functionally similar elements. Additionally, the left-most one or two digits of a reference numeral identifies the drawing in which the reference numeral first appears.

DETAILED DESCRIPTION

Figure 1:
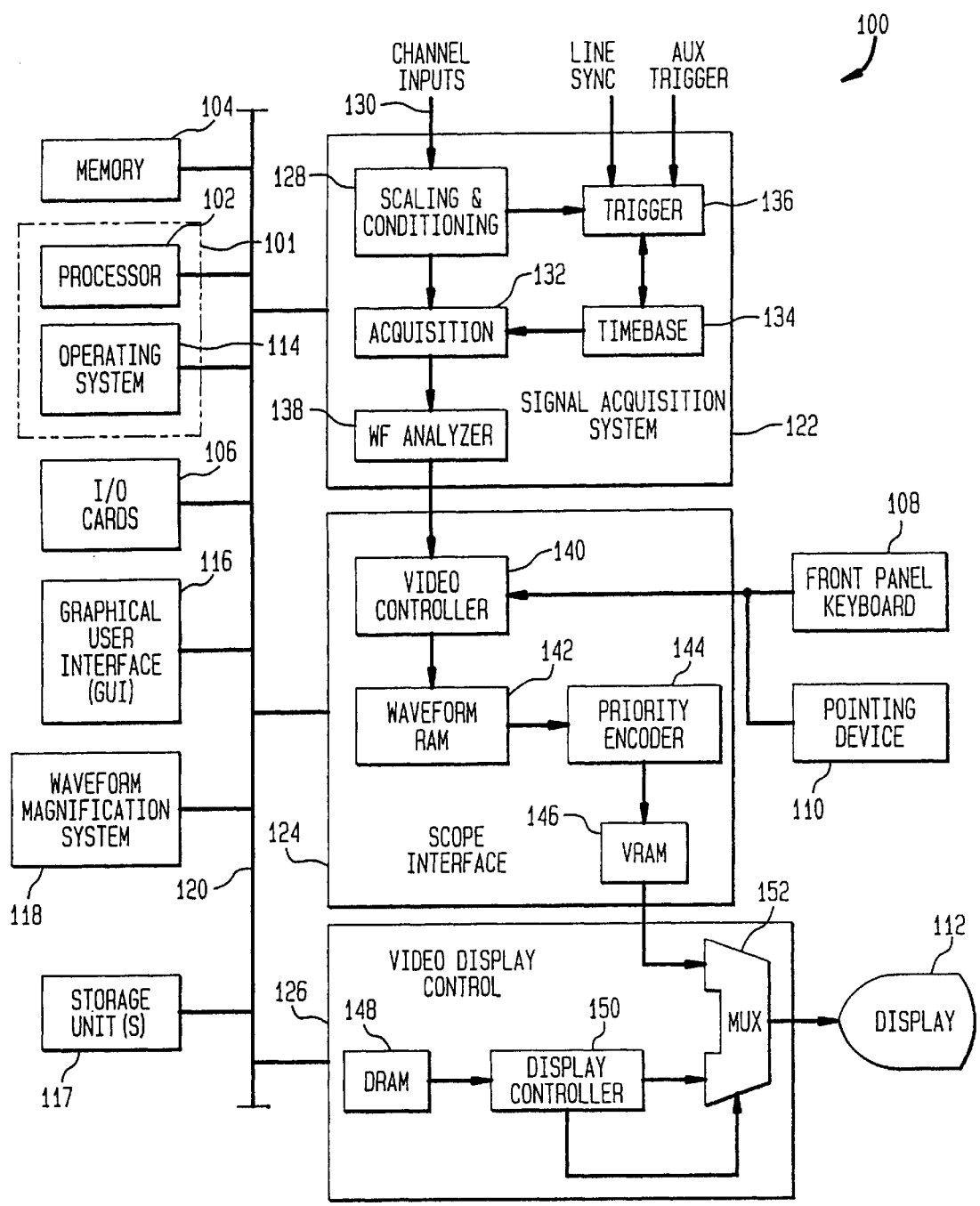
FIG. 1 is a functional block diagram of a digital oscilloscope suitable for implementing the waveform magnification system and method of the present invention.

The present invention is a waveform magnification system and method that may be implemented in any signal measurement system having a graphical user interface. In one preferred embodiment of the present invention, the system is implemented in a test and measurement instrument, such as a digital or analog oscilloscope, logic analyzer, network analyzer, spectrum analyzer, or waveform generator. FIG. 1 is a functional block diagram of an exemplary digital oscilloscope suitable for implementing the waveform magnification system and method of the present invention.

The digital oscilloscope 100 is a commonly-available digital oscilloscope designed to acquire, analyze, and display a wide variety of signals generally in terms of signal voltage versus time. The digital oscilloscope 100 preferably includes a general purpose computer system, which is programmable using a high-level computer programming language and specially programmed, special purpose hardware for performing signal acquisition, analysis and display functions.

The digital oscilloscope 100 includes a processor 102, a memory unit 104, input/output interface cards 106, storage units 117 such as a hard disk drive and a floppy disk drive, one or more input devices such as front panel keyboard 108 and pointing devices 110 and display 112. The memory 104 is used for storage of program instructions and for storage of results of calculations performed by the processor 102. In a preferred embodiment, the memory 104 includes random access memory (RAM). The display 112 is preferably a liquid crystal display and is logically or physically divided into an array of picture elements referred to as pixels. The inputs/output interface cards 106 may be modem cards, network interface cards, sound cards, etc.

The processor 102 is typically a commercially available processor such as the Pentium microprocessor, PowerPC microprocessor, SPARC processor, PA-RISC processor or a 68000 series microprocessor. Many other processors are also available. Such a processor usually executes a program referred to as an operating system 114 such as the various versions of the Windows operating systems from Microsoft Corporation, the NetWare operating system available from Novell, Inc., or the Unix operating system available from many vendors such as Sun Microsystems, Inc. and Hewlett Packard. The operating system 114 controls the execution of other computer programs such as a graphical user interface (GUI) 116 and the waveform magnification system 118, and provides scheduling, input/output control, file and data management, memory management and related services. The processor 102 and operating system 114 define a computer platform shown by dashed block 101, for which application programs and high-level programming languages are written. The functional elements of the digital oscilloscope 100 communicate with each other via one or more buses 120.

The digital oscilloscope 100 includes a signal acquisition sub-system 122, a scope interface sub-system 124 and a video display control sub-system 126. The signal acquisition sub-system 122 includes a scaling and conditioning unit 128 that receives input signals through channel inputs 130. The scaling and conditioning unit 128 and acquisition unit 132 include well-known high frequency electronics for signal acquisition, signal conditioning and analog-to-digital conversion, all of which are controlled by the computer system 101 and are considered to be well-known in the art. The time base unit 134 drives the analog-to-digital process performed by the acquisition unit 132, specifying when to sample the input signals and the number of samples to be taken. The trigger circuitry 136 synchronizes the acquisition process through the time base 134, enabling the operator to arrange a trigger event to obtain a stable waveform display of the desired features of one or more of the input signals. Trigger circuitry 136 may be based upon a line sync or auxiliary trigger input as is well-known in the art.

The waveform analyzer 13 8 performs measurement processes for developing the waveform for display. The waveform analyzer 138 contains hardware and software components to perform well-known operations such as setting the analog-to-digital codes for the acquisition unit 132 and mapping the resulting digital information to the physical pixel locations which are ultimately presented on the display 112 under the control of the graphical user interface 116. The pointing device 110 and/or the keyboard 108 are used to move a cursor on the GUI-controlled display 112 to select display elements adjacent to or under the cursor. The pointing devices 110 may include any well-known pointing devices such as a mouse, trackball or joystick. The cursor may additionally be controlled with any one or more keyboards located externally or integrated into a front panel of the digital oscilloscope 100.

The scope interface sub-system 124 includes a video controller 140 that controls the rendering of pixels into a waveform random access memory (RAM) 142. The video control sub-system 126 also receives display element control commands and cursor input information from the front panel keyboard 108 and the pointing device 110. The waveform RAM 142 includes a data structure for each pixel location on the display 112. The data structures contain information regarding every display element that is to be drawn at each pixel location. Although there may be multiple display elements which are to be drawn at a given pixel location, only one color may be rendered at that location at any given time. The waveform RAM 142 supplies a priority encoder 144 with information regarding which display elements are to be displayed at each pixel location. The priority encoder 144 prioritizes the competing display elements. For example, if the operator arranged a marker and a waveform such that they are located in the same pixel location, then the priority encoder 144 selects that display element which has the highest predetermined priority. In such an example, the color of the marker is preferably rendered at that pixel location providing a display that appears to show the marker over the competing waveform. The priority encoder 144 then sends the selected color to the video RAM (VRAM) 146 which then causes the pixel to be rendered in the indicated color.

The video display control subsystem 126 includes a dynamic random access memory (DRAM) 148 which contains data specifying a color for each pixel in the display 112. Likewise, the VRAM 146 also contains data specifying a color for each pixel in the display 112. The computer system 101 controls the information and DRAM 148 while the signal acquisition system 122 controls the information in the VRAM 146. For each pixel in the display 112, the video display control subsystem 126 selects whether the pixel in the display 112 is to be specified from the VRAM 146 or the DRAM 148. In general, information in the VRAM 146 includes digitized waveforms being generated by the signal acquisition sub-system 122 with high rates of change which are much too fast for software processing by the computer system 101 for real-time display of the waveforms on the display 112.

The video display control sub-system 126 includes a display controller 150 and a multiplexer 152. The controller 150 controls which of the two inputs to the multiplexer 152 are processed into display signals for transmission to the display 112 under the control of the graphical user interface 116. The display controller 150 typically monitors color data send from the DRAM 148 and may be programmed to switch to multiplexer 152 to a different input once a particularly programmed color is received from the DRAM 148. A rectangular pixel area is typically defined within DRAM 148 with the programmed color. The programmed color is not displayed but instead serves as a data path switch control for the multiplexer 152. Therefore, within the programmed color rectangle, display data comes from VRAM 146. If various control functions are needed, an interactive dialog box may be drawn within the programmed color rectangle. This, as noted, prevents the information from the VRAM 146 from being displayed in the area occupied by the dialog box.

The waveform magnification system 118 implements a simple and intuitive method for performing automatic magnification of a desired portion or region of a waveform display presented on the graphical user interface 116. The waveform magnification system 118 simultaneously displays an original or main waveform display containing the displayed waveforms on a portion of the display and a magnified waveform display displayed on another portion of the display screen. The magnified waveform display provides a magnified view of an operator-selected region of the main waveform display. This region is defined by an extent (scale) and the position (offset) for each of two axes of a selection window positioned over the main waveform display to encompass the desired region to be magnified. The selection window may be positioned by the operator so as to encompass any desired region of the main waveform display and not degrade the informational content present on the main waveform display. In particular, the present invention provides graphical manipulation techniques for controlling the selection window. The selected waveform region displayed in the selection window is graphically associated with the magnified waveform display to assist the operator in visually correlating the informational content of the original and magnified views of the selected waveform region. Through the implementation of various graphical techniques, the present invention clearly displays this association while retaining all of the information of the main waveform display. For example, in one embodiment the selection window is rendered on top of the waveform display to ensure it is not obscured by waveforms and related information displayed on the waveform display. Furthermore, the background color of the main waveform display is altered outside of the region constituting the magnified view so that the contrast between the background and the waveforms is reduced. This communicates a relative importance of the selected and non-selected regions of the main waveform display and associates the selected region with the magnified view. Thus, an operator can observe all information provided by the signal measurement system related to the displayed waveform while concurrently observing a magnified waveform display that is visually associated with a selected waveform display region.

The software routines for performing the waveform magnification methodology in accordance with the present invention typically resides in memory 104 and/or storage units 117, and may be stored on a computer-readable medium such as, for example, magnetic disk, compact disk, or magnetic tape, and may be loaded into the digital oscilloscope 100 using an appropriate peripheral device as is known in the art.

Preferably, the waveform magnification system 118 is implemented in any well-known programming language such as C or C++. Those skilled in the relevant art will appreciate that different implementations, including different function names, programming languages, data structures, and/or algorithms may also be used in embodiments of the present invention other than those described below. It should be further understood that the invention is not limited to a particular computer platform, particular operating system, particular processor, or particular high-level programming language, and that the hardware components identified above are given by way of example only. Portions of the waveform magnification system may be implemented, for example, in dedicated hardware, frameware, or any combination thereof.

Figure 2:
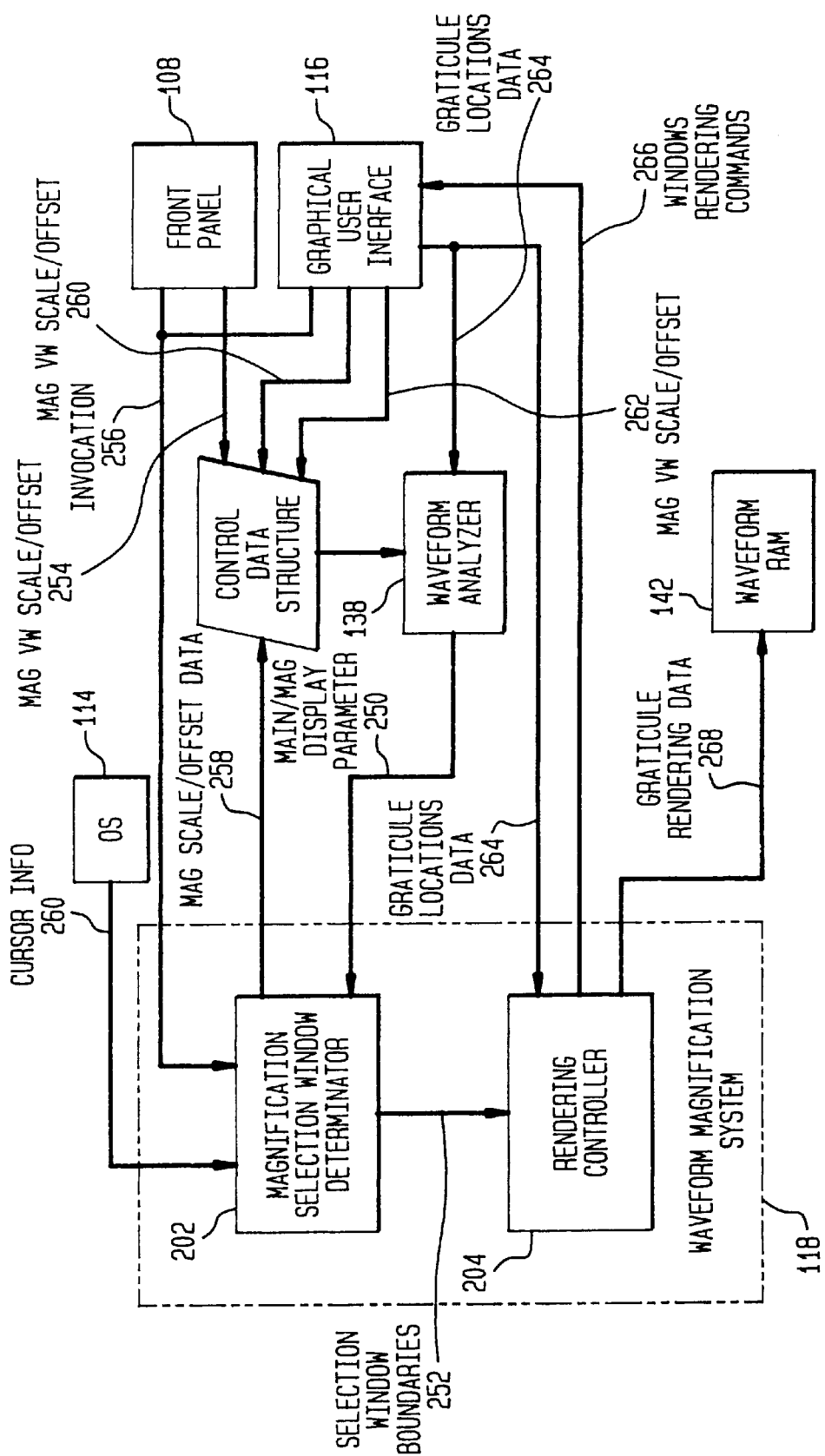
FIG. 2 is a functional block diagram of one embodiment of the waveform magnification system of the present invention.

A functional block diagram of one preferred embodiment of the measurement invocation system 118 of the present invention implemented in the digital oscilloscope 100 is shown in FIG. 2. A preferred implementation of the present invention is in test and measurement equipment having a graphical user interface 116, such as the digital oscilloscope 100 illustrated in FIG. 1. The functions and operations of the waveform magnification system 118 will be described below with reference to the exemplary graphical user interface displays illustrated in FIGS. 3A through 3E.

Figure 3A:
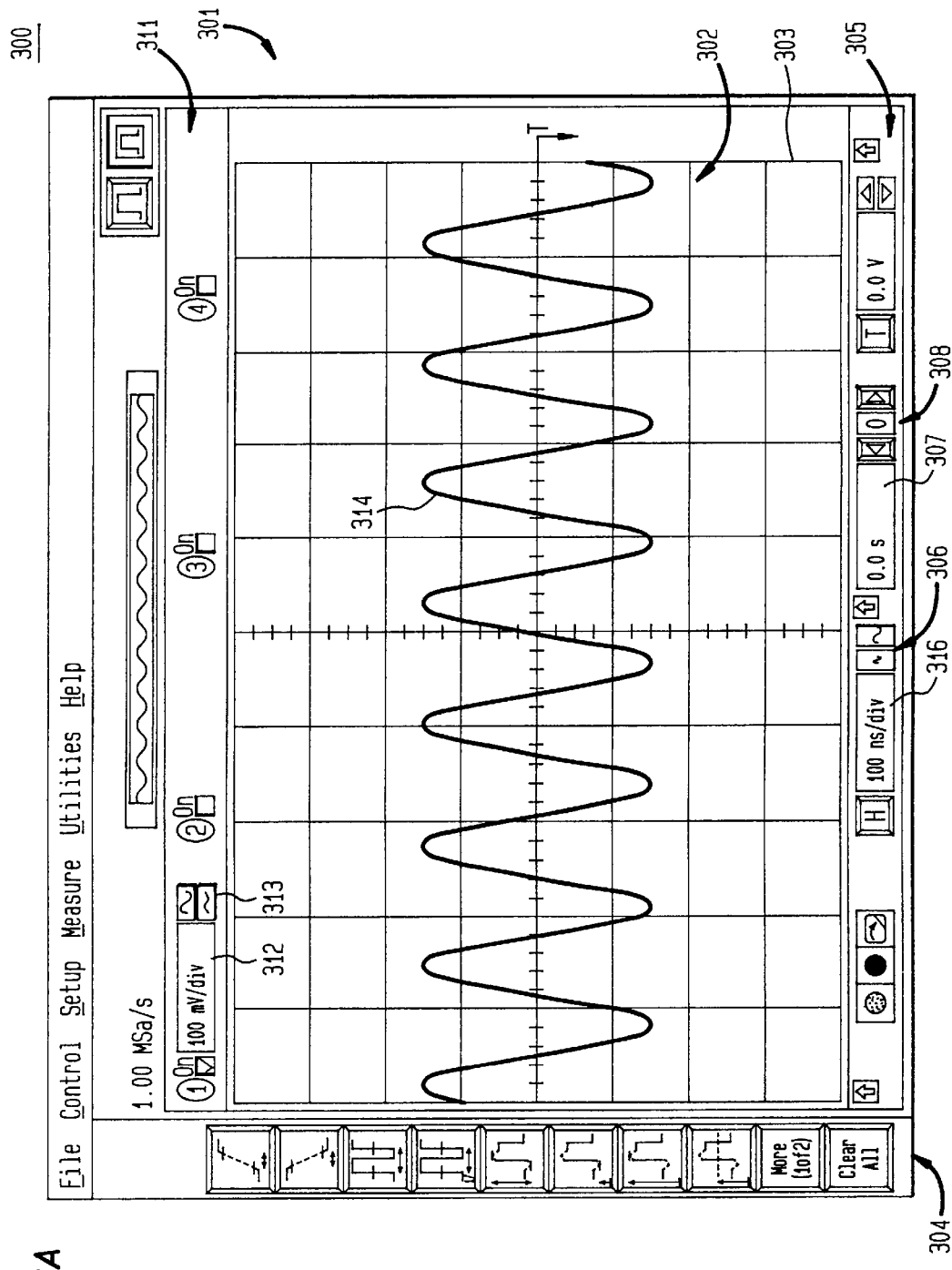
FIG. 3A is an illustration of a graphical user interface display showing a main view window encompassing a significant portion of the display screen prior to the invocation of the waveform magnification system of the present invention.

Referring to FIG. 3A, when the waveform magnification system 118 of the present invention has not been invoked, a main view window 301 is displayed by the graphical user interface 116 over a substantial portion of the GUI display 300. The main view window 301 includes a main waveform display 302 on which one or more waveforms and other display elements are presented over a graticule 303. The waveform display 302 is surrounded by a number of information and control menu bars adjacent to its periphery. One such bar is a measurement toolbar 304 shown to be adjacent to the left-hand side of the waveform display 302. Other toolbars include a channel status toolbar 311 and a waveform display toolbar 305. As used herein, the term "view window" refers to a waveform display and associated toolbars that specifically support the information presented on the associated waveform display such as the waveform display toolbar 305. In the illustrative example shown in FIGS. 3A through 3E, a single waveform 314 is displayed in the main waveform display 302. The waveform 314 is identified as being a channel 1 waveform on the channel status toolbar 311 shown above the waveform display 302. On the channel status toolbar 311, a graphical vertical scale control 313 and a graphical display 312 of a current vertical scale setting are also presented for each channel that has a waveform displayed in the main waveform display 302. As shown in FIG. 3A, the vertical scale window 312 indicates that the displayed waveform 314 has a vertical scale of 100 millivolts/division (mV/div).

The waveform display toolbar 305 provides information pertaining to the horizontal scale and offset of the associated waveform display 302. The waveform display toolbar 305 includes a horizontal scale control 306 for controlling the horizontal scale of the waveform display, and a horizontal offset control 308 for controlling the horizontal offset of the waveform display 302. An associated horizontal scale display window 316 presents the current horizontal scale of the waveform display 302 to the operator. Likewise, an associated horizontal offset display window 307 presents the current horizontal offset of the waveform display 302 to the operator. The horizontal scale of the channel one waveform 314 illustrated in FIG. 3A is 100 ns/div with a horizontal offset of 0.0 seconds.

Figure 3B:
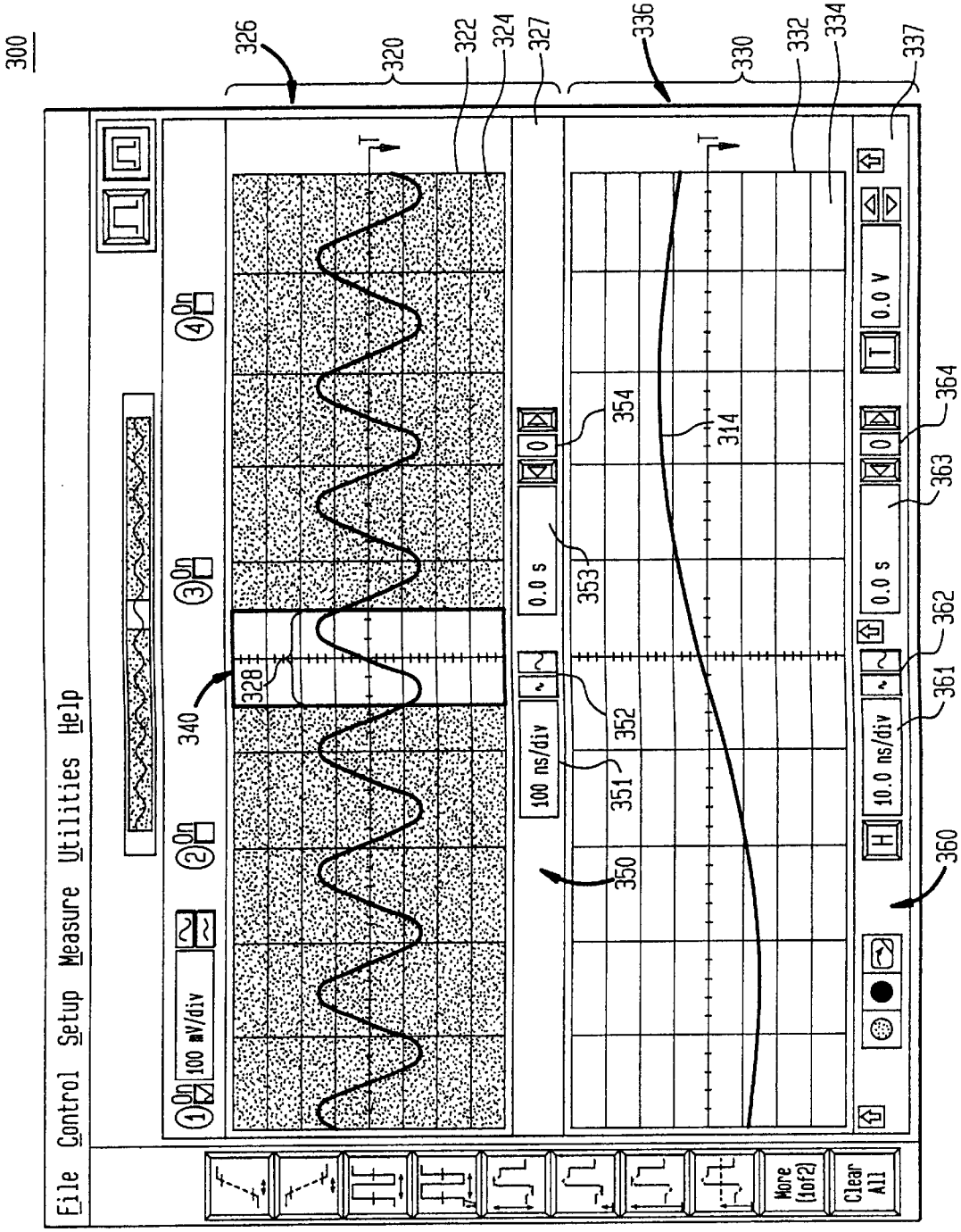
FIG. 3B is an illustration of a graphical user interface display showing the main view window and a magnified view window simultaneously displayed with a selection window encompassing a portion of the main waveform display.

FIG. 3B is an illustration of the graphical user interface display 300 presented in accordance with one embodiment of the present invention. Upon invocation of the waveform magnification system 118, a dual window arrangement such as that shown in FIG. 3B is displayed on the GUI display 300 by the present invention in conjunction with the graphical user interface 116 to simultaneously display a main waveform display and a magnified waveform display.

The display 300 is partitioned among a main view window 320 and a magnified view window 330. The main view window 320 includes a graticule 322 that is reduced in size from that displayed in FIG. 3A so as to provide sufficient display area for the display of the magnified view window 330.

In the illustrative embodiment, the main view window 320 is presented towards the top of the display 300 while the magnified view window 330 is presented towards the bottom of the display 300. This approach is consistent with traditional oscilloscopes which present a main and magnified view region across the top and bottom of the display 300, respectively. It should be understood, however that the main view window 320 and the magnified view window 330 may be presented at arbitrary locations and sizings on the display 300.

In one embodiment, the portion of the display area that is allocated to each of the view windows 320 and 330 is determined by the current graphical mode of the display 300. For example, in the illustrative embodiment, the illustrated graphical mode is one in which the measurement toolbar 304 is displayed. In this case, the display area occupied by the toolbar 304 is not available to the view windows 320 and 330. Accordingly, the processes performed by certain embodiments of the present invention consider the graphical mode of the display 300 when rendering the main view window 320 and the magnified view window 330. However, in the following discussion, this functionality resides within a graphical user interface 116 which provides the available graticule size and location to the present invention.

The main view window 320 includes the main graticule 322 and associated supporting window 327. Likewise, the magnified view window 330 includes the magnified graticule 332 and supporting window 337. In both instances, the windows 327, 337 include the associated waveform display toolbar 350, 360. The scaling and offset of the main waveform display 326 and the magnified waveform display 336 are controllable through the graphical user interface 116 when in the "dual view mode" of operation. To accomplish this, the waveform display toolbar 360 is assigned to the magnified waveform display 326 while the waveform display toolbar 350 is assigned to the main waveform display 336. The main waveform display toolbar 350 performs the same functions as the waveform display toolbar 350 illustrated in FIG. 3A. The main waveform display toolbar 350 includes horizontal scale control buttons 352 and window 351 for controlling and displaying the horizontal scale of the main waveform display 326. The toolbar 350 also includes horizontal offset control buttons 354 and window 353 for controlling and displaying the horizontal offset of the main waveform display 326. Likewise, the magnified waveform display toolbar 360 has a similar structure and performs similar operations as the main waveform display toolbar 350. The toolbar 360 includes horizontal scale controls 362 and a horizontal scale window 361 for controlling and displaying the horizontal scale of the magnified waveform display 336. The toolbar 360 also includes horizontal offset controls 364 and a horizontal offset window 363 for controlling and displaying the horizontal offset of the magnified waveform display 336. The function and operation of the horizontal offset and scale controls of the magnified waveform display 336 and the corresponding effect on the selection window 340 of the present invention is described in detail below.

There are analogous horizontal and vertical scale and offset controls on the front panel 108. The values of such controls are provided to the waveform analyzer 138. During normal operations, these scale and offset controls provide an operator with the ability to adjust the associated parameter of the main waveform display 302 illustrated in FIG. 3A. In one embodiment of the present invention, the front panel offset and scale controls are reassigned to control the horizontal scale and offset of the magnified waveform display 336 when the magnified view window 330 is displayed. This is shown in FIG. 2 by the front panel 108 providing to the waveform analyzer 138 the magnified view scale and offset control data 254. In an alternative embodiment, the original assignments are maintained and the front panel 108 implements soft keys to generate the magnified view scale and offset control inputs 254. It should be understood that any other method for providing the operator with the ability to control the scale and offset of either waveform display through the front panel 108 may be used. Alternatively, the front panel offset and scale controls may simply be disabled and replaced by graphical controls, such as those shown on the waveform display toolbars 350 and 360.

In accordance with one embodiment of the present invention, an operator-controlled magnification selection window 340 is displayed over the main waveform display 326 in the main view window 320. The selection window 340 encompasses and defines an operator-selected region of the main waveform display 326 for which a magnified waveform display 336 is presented simultaneously in the magnified view window 330. The selection window 340 is initially displayed on the main waveform display 326 upon invocation of the system 118. Initially, the selection window 340 is set to a default scale and offset which may be subsequently altered by the operator in accordance with the present invention. In the illustrative embodiment illustrated in FIG. 3B, the selection window 340 captures the entire vertical extent and the center 10% of the horizontal extent of the main waveform display 326. Thus, in the embodiment illustrated in FIG. 3B, the selection window 340 extends horizontally for 0.5 divisions on each side of the horizontal offset to encompass one division of the main waveform display 326. Since there are 10 horizontal divisions in the illustrated main graticule 322, the selection window 340 encompasses one division or 10% of the main waveform display 326.

In addition to the selection window 340, display features providing a graphical association between the waveform region 328 and the selection window 340 and the expanded view of the same waveform region in the magnified view window 330 are provided in alternative embodiments of the present invention. In one such embodiment, the background 342 of the selected region 328 of the main waveform display 326 which lies within the selection window 340 is rendered in the same color or gray scale as the background 334 of the magnified waveform display 336. Furthermore, the background 324 of the main waveform display 326 that is not within the selection window 340 is rendered in a different color or gray scale than the backgrounds 342, 334. In the exemplary embodiment illustrated in FIG. 3B, the contrast between the background 324 and the waveforms 314 displayed in the main waveform display 326 is reduced. For example, when the main waveform background is black, the background 324 is rendered in a gray shade. This communicates to the operator that the information in the non-selected region of the main waveform display 326 is de-emphasized relative to the information within the selection window 340. Moreover, in a preferred embodiment the background 342 of the selected region 328 and the background 334 of the magnified waveform display 336 are rendered in the same normal background color. This reinforces the association between the two views as well as visually emphasizes the selected region 328. As shown in FIG. 3B, this provides an overall graphical display of a magnified view of a windowed region 328 of the main waveform display 326. This provides an easy and intuitive technique for enabling an operator to associate the selected waveform region 328 and the waveform region displayed in the magnified view window 330.

Referring now to FIG. 2, the waveform magnification system 118 of the present invention broadly includes a magnification selection window determinator 202 and a rendering controller 204. The determinator 202 determines a horizontal and vertical scale and offset for the operator-controlled selection window 340 and the associated magnified waveform display 336. The determinator 202 also provides the operator with the ability to graphically manipulate the selection window 340 to achieve a scale and offset so as to encompass a desired region 328 of the main waveform display 326. As a result, the present invention enables an operator to directly interact with the waveform display to select a desired waveform display region for magnified viewing. Furthermore, the graphical techniques of the present invention enable an operator to select the scale (extent) and offset (position) of the magnified view quickly and easily. Thus, a graphical approach for directly interacting with the waveform display to select for magnification a desired waveform display region is provided.

The rendering controller 204 controls the rendering of the main view window 320, magnification view window 330, and selection window 340 based upon the operator-selected scale and offset values and the graphical mode of the display 300. The rendering controller 204 also controls the rendering of graphical items that are used to associate the magnified waveform display 336 and the selected region 328 of the main waveform display 326. This enables the present invention to implement any predetermined graphical technique to clearly communicate the relationship between the contents of the main and magnified view windows while retaining all of the information contained in the main waveform display 326. Thus, an operator may observe all information provided by the signal measurement system 100 related to the displayed waveforms while simultaneously observing a magnified view of a selected portion of the displayed waveforms.

Figure 3C:
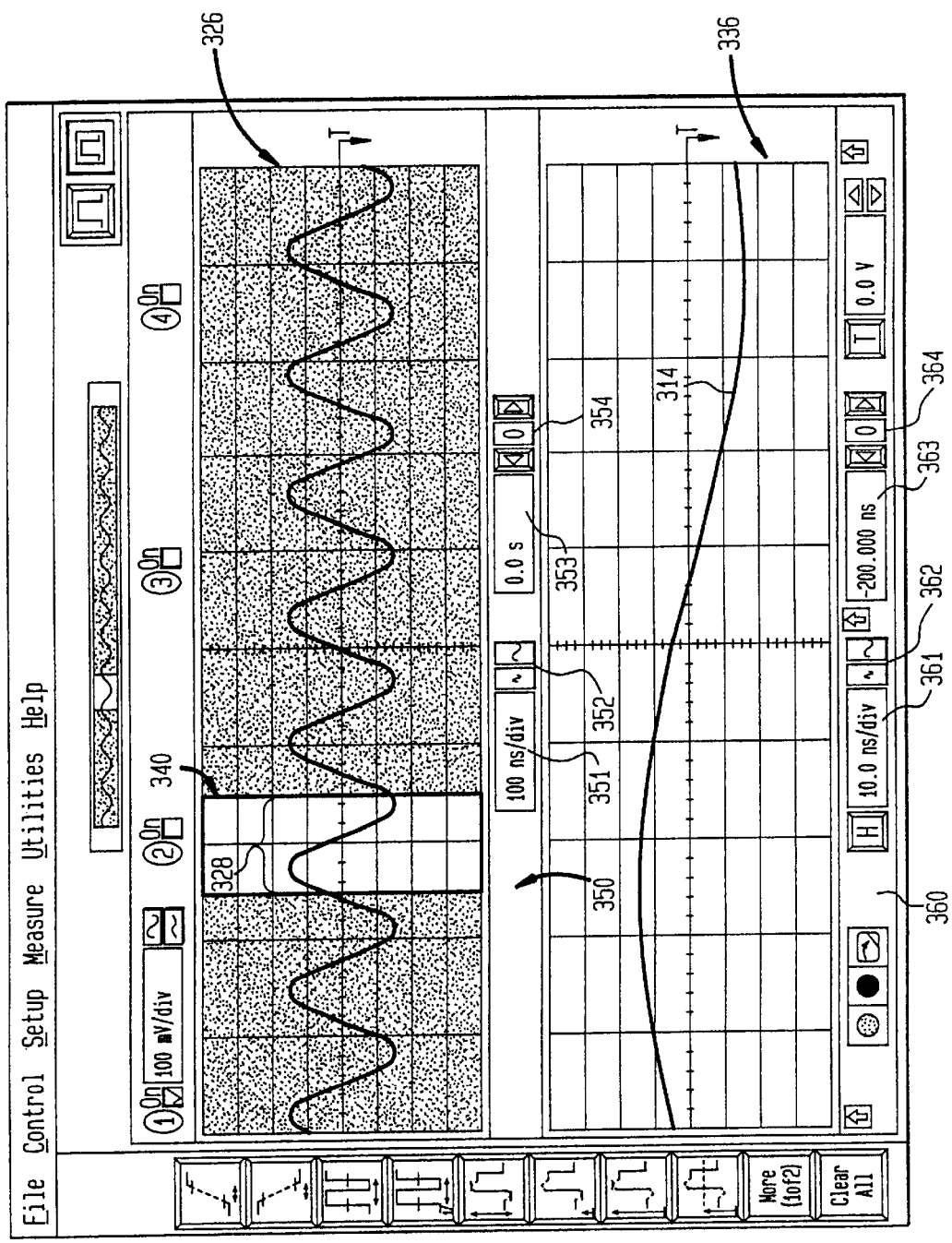
FIG. 3C is an illustration of the graphical user interface display illustrated in FIG. 3B having a magnified waveform display horizontal offset which is less than that displayed in FIG. 3B.

FIG. 3C is a diagram illustrating the graphical user interface display 300 of FIG. 3B after an operator has adjusted the position or offset of the selection window 340. There are a number of available methods to change the scale and offset of the selection window 340 in the illustrated embodiment of the present invention. These include the use of the front panel scale and offset controls, generating the magnification waveform display scale/offset data 254; the use of the horizontal offset control buttons 364 on the magnified waveform display toolbar 360, generating magnified waveform display scale/offset data 262; and through the graphical manipulation of the selection window 340 as described below, generating magnified waveform display scale/offset data 258, all of which are received by the waveform analyzer 138. Other methods for adjusting the horizontal offset or scale, such as dialog boxes, pull-down menus, etc., are considered to be within the scope of the present invention.

Regardless of the method employed, the resulting position of the selection window 340 is displayed in the horizontal offset display window 363 in the tool bar 360. In FIG. 3C, the selection window 340 is positioned from a horizontal offset of 0.0 seconds (FIG. 3B) to a horizontal offset of −200.00 ns. This causes the selection window 340 to travel to a different position on the main waveform display 326. Note that the offset of the main waveform display 326 has not been adjusted and remains at 0.0 seconds as shown in the horizontal offset window 353 of the main waveform display toolbar 350.

Figure 3D:
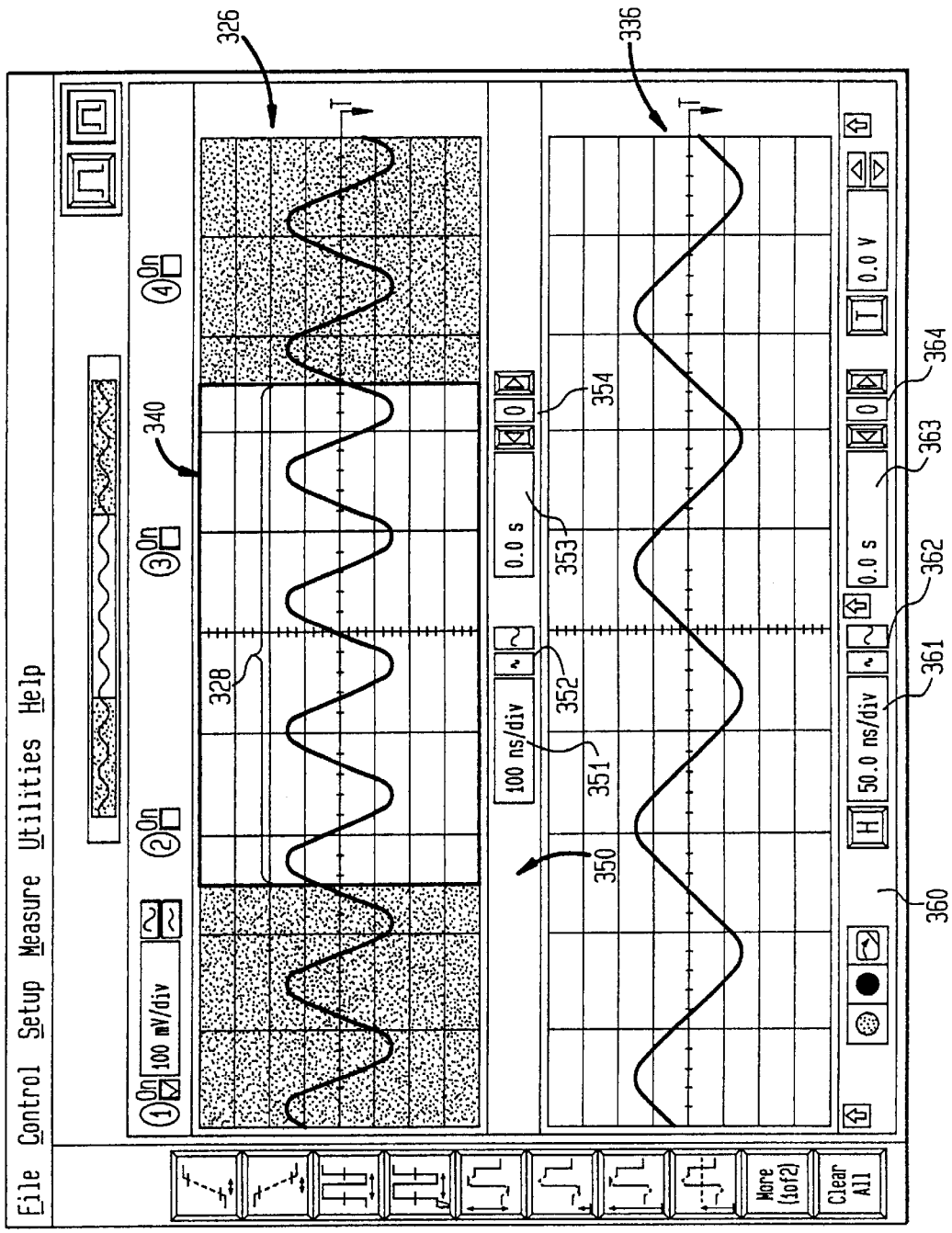
FIG. 3D is an illustration of the graphical user interface display illustrated in FIG. 3B with the magnified waveform display having a horizontal scaling which is greater than that displayed in that of FIG. 3B.

FIG. 3D is a diagram illustrating the graphical user interface display 300 illustrated in FIG. 3B after an operator has adjusted the horizontal scale of the selection window 340 and magnified waveform display 332. Similar methods are available to modify the horizontal scale as those described above for the changing the horizontal offset. The resulting scale of the magnified waveform display 336 and selection window 340 is displayed in the horizontal scale display window 361 of the toolbar 360. In FIG. 3D, the horizontal offset of the selection window 340 and magnified waveform display 336 is adjusted from a horizontal scale of 10.0 ns/div. (FIG. 3B) to a horizontal scale of 50.00 ns/div. This causes the selection window 340 to encompass a total of five divisions centered about the main horizontal offset value of 0.0 ns (±250 ns). The horizontal scale of all of the displayed waveforms is adjusted accordingly in the magnified waveform display 336.

Figure 3E:
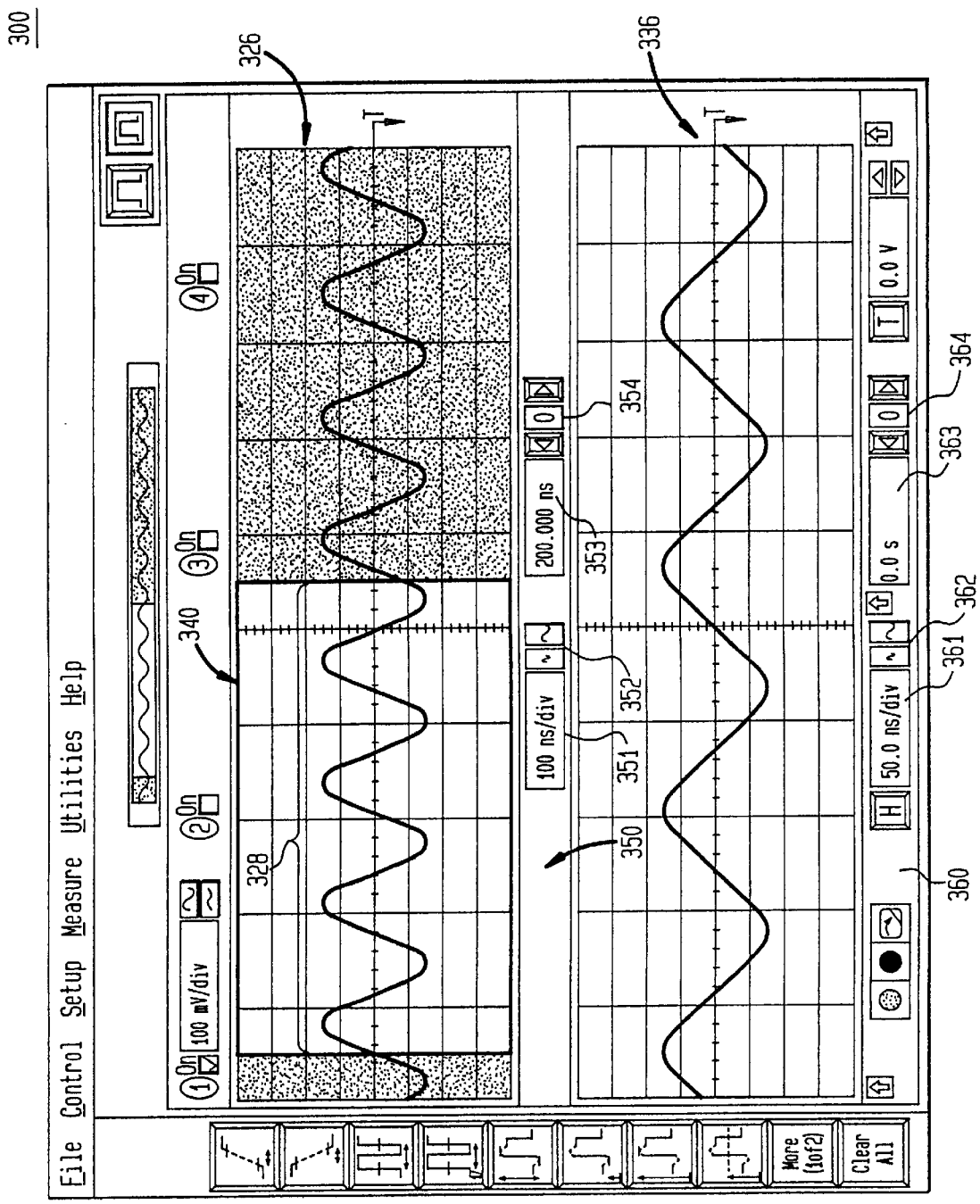
FIG. 3E is an illustration of the graphical user interface display illustrated in FIG. 3D with the main waveform display having a horizontal offset which is greater than that illustrated in FIG. 3D.

FIG. 3E is a diagram of the graphical user interface display 300 showing the position of the selection window 340 illustrated in FIG. 3B after the horizontal offset of the main waveform display 326 is adjusted. The main waveform display horizontal offset, as shown in the horizontal offset window 353 of the main waveform display toolbar 350, is adjusted from a value of 0.0 ns (FIG. 3D) to a value of 200.000 ns (FIG. 3E). Since the magnified waveform display offset remained at 0.0 ns as shown in the horizontal offset window 363 of the toolbar 360, the selection window 340 is shifted two divisions to the left to remain centered about the magnified horizontal offset of 0.0 ns. It should be understood and observed that the magnified waveform display 336 has not been altered and therefore is the same as that shown in FIG. 3D.

Figure 4:
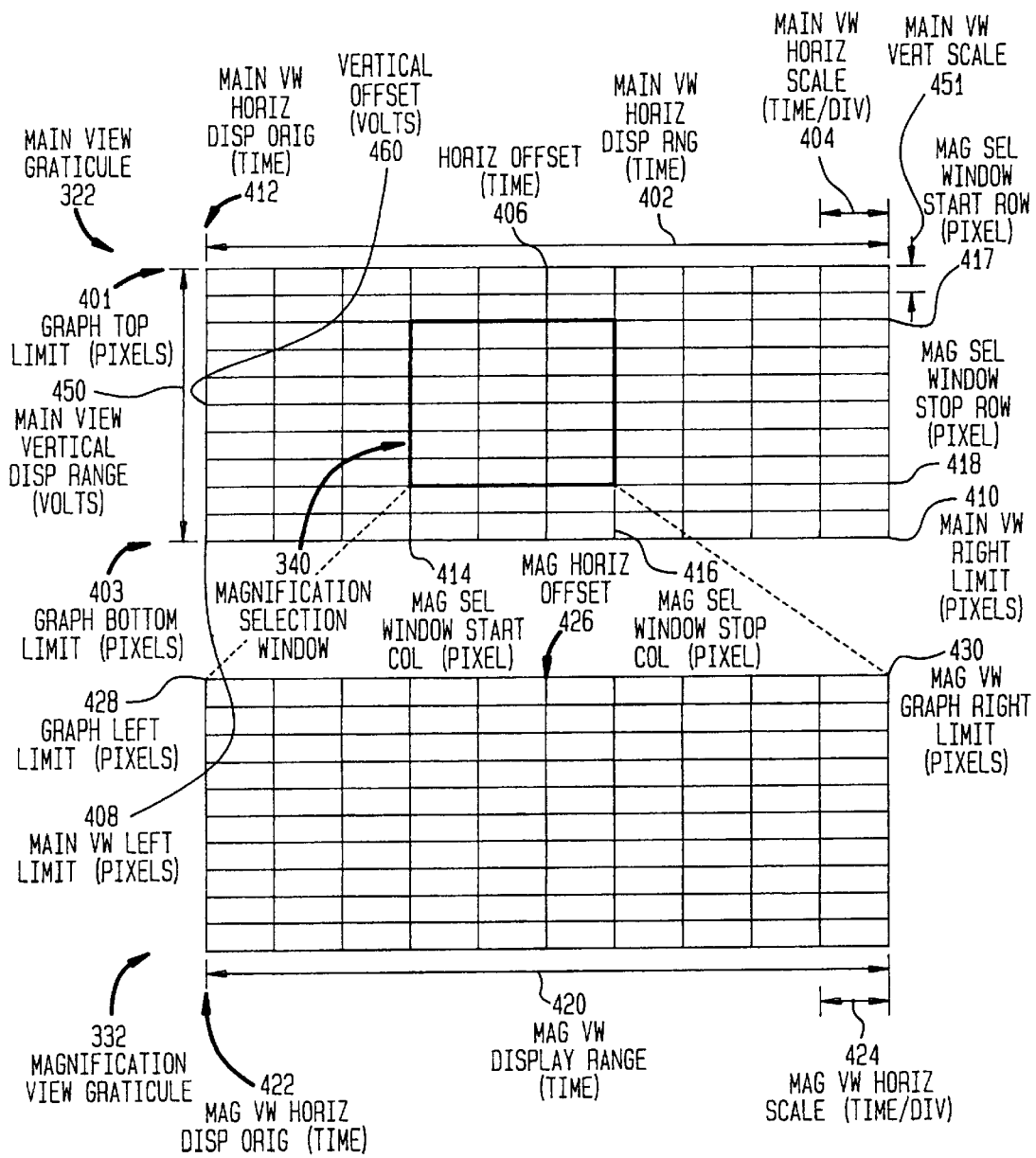
FIG. 4 is a perspective view of a main and magnified view window graticules with an exemplary selection window, illustrating the various extent and position values determined in one embodiment of the present invention.

FIG. 4 is perspective view of the main graticule 322 and magnified graticule 332 created in accordance with one embodiment of the present invention. The location of the graticules 322 and 332 on the graphical user interface display 300 is determined from the graticule locations 264 received from the graphical user interface 116. The main view window horizontal scale (MainVWHorizScale) 404 represents sweep speed and is in units of time per division. At the center of the horizontal axis is the horizontal offset 406 representing the delay or horizontal position of the displayed waveforms. Together with the main view window vertical scale 451 (in units of volts per division) and a main view vertical offset 460 (in units of volts), these quantities define the main view graticule 322. The boundaries of a selection window 340 are shown in the main graticule 322. The boundaries of the selection window 340 are defined by a start and stop pixel column 414, 416 along the horizontal axis and a start and stop pixel row along the vertical axis.

The waveform analyzer 138 and the magnification selection window determinator 202 perform various scaling and position calculations to determine the location in which the main waveform display 326 and the magnified waveform display 336 are to be rendered on the graphical user interface display 300. Furthermore, such calculations are also used to determine the location at which to render the supporting windows 327, 337. For ease of description, these calculations will be described with reference to one particular embodiment of the present invention wherein the vertical extent of the selection window 340 is not adjustable by the operator and is fixed to include the entire vertical extent of the main waveform display 326. In such an embodiment, the start and stops rows 417 and 418 coincide with the main view window top limit 401 and bottom limit 403, respectively. The main view window graph left limit (MainVWLeftLimit) 408 and the main view window graph right limit (MainVWRightLimit) 410 are the pixel location limits on the display 300 for the main view graticule 322. These values are provided to the waveform magnification system 118 by the graphical user interface 116 in the graticule locations data 264.

The main view window horizontal displayed range (MainVWHorizDispRng) 402 is the time across the entire main graticule 322. The main view window horizontal display range 402 is the product of the number of horizontal divisions in the main graticule 322 (MainGratDiv) and the current horizontal scale (MainVWHorizScale) 404. The current horizontal scale may be a default or operator selected value and is displayed in the horizontal scale window 351 of the main waveform display toolbar 350. As will be described in detail below, the number of horizontal divisions in the main graticule 322 and the current horizontal scale values are provided as inputs to the magnification system 118 from the waveform analyzer 138 as part of the main/mag display parameters 250. In the illustrative embodiment shown in FIGS. 3B and 4, this would result in:

$$\begin{aligned}\text{MainVWHorizDispRng} &= (\text{MainGratDiv})\,(\text{MainVWHorizScale}) \\ &= (10 \text{ div})\,(100 \text{ ns/div}) \\ &= 1000 \text{ ns}\end{aligned}$$

As is well known, this display range is centered about the horizontal offset 406.

The main view window graph left limit (MainVWLeftLimit) 408 and main view window graph right limit (MainVWRightLimit) 410 are the pixel location limits of the main view graticule 322. The main view window horizontal display origin (MainVWHorizDispOrig) 412 is the time at the left edge of the main view graticule 322 (that is, at the MainVWLeftLimit 408). This is determined based upon the horizontal offset 406 and the main view window horizontal displayed range 402. In the illustrative embodiment illustrated in FIGS. 3B and 4, this would yield:

$$\begin{aligned}\text{MainVWHorizDispOrig} &= (\text{HorizOffset}) - (\text{MainVWHorizDispRange})/2 \\ &= (0.0 \text{ sec}) - (1000 \text{ ns})/2 \\ &= -500 \text{ ns}\end{aligned}$$

As noted, the horizontal offset 406 and the horizontal scale 404 are provided to the waveform analyzer 138 from the graphical user interface 116 via the main view window scale/offset input 260. In accordance with one embodiment of the present invention, the horizontal offset 406 and scale 404 of the main view window are graphically controllable and provided to the waveform analyzer 138 by the determinator 202 via a main view window scale/offset input 254. In addition, the number of horizontal divisions in the main graticule 322 is provided to the waveform analyzer 138 as part of graphical locations 264 generated by the graphical user interface 116. The above values for the main view window horizontal display range 402 and the main view window horizontal display origin 412 are provided to the magnification selection window determinator 202 as part of the main/mag display parameters 250 from the waveform analyzer 138.

Similar scaling calculations are also performed for the magnified view. A magnified view window displayed range (MagVWHorizDispRng) 420 is the product of the number of horizontal divisions in the magnified graticule 332 (MagGratDiv) and the current magnified horizontal scale (MagVWHorizScale) 424. The current magnified horizontal scale 424 may be set, as noted, by any of the above methods and displayed in the horizontal scale window 361 of the waveform display toolbar 360. In the illustrative embodiment shown in FIGS. 3B and 4, this would result in:

$$\begin{aligned}\text{MagVWHorizDispRng} &= (\text{MagGratDiv})\,(\text{MagVWHorizScale}) \\ &= (10 \text{ div})\,(10 \text{ ns/div}) \\ &= 100 \text{ ns}\end{aligned}$$

This range is centered about the horizontal offset 426.

The magnified view window horizontal display origin (MagVWHorizDispOrig) 422 is the time at the left edge of the magnified view graticule 332 (at MagVWLeftLimit 428). This is determined based upon the horizontal offset 426 and the magnified view window horizontal displayed range 420. In the illustrative embodiment illustrated in FIGS. 3B and 4, this would yield:

$$\begin{aligned}\text{MagVWHorizDispOrig} &= (\text{HorizOffset}) - (\text{MagVWHorizDispRange})/2 \\ &= (0.0 \text{ sec}) - (100 \text{ ns})/2 \\ &= -50 \text{ ns}\end{aligned}$$

The above values may also be calculated based upon the ratio between the current graticule size and scale settings of the main and magnified views. A window ratio representing the ratio of waveform displays on the main and magnified view windows is calculated as the ratio of the main view window displayed range (MainVWHorizDispRange) 402 and the magnified view window displayed range (MagVWDispRange). In the illustrative embodiment illustrated in FIGS. 3B and 4, this would yield:

$$\begin{aligned}\text{WindowRatio} &= (\text{MagVWHorizDispRng})/(\text{MainVWHorizDispRng}) \\ &= (100 \text{ ns})/(1000 \text{ ns}) \\ &= 10\%\end{aligned}$$

And, therefore,

MagVWHorizDispRng=(MainVWHorizDispRng)(WindowRatio).

In the illustrative embodiment, the magnification selection window determinator 202 receives the above values from the waveform analyzer 13 8 and determines the pixel locations identifying the selection window boundaries. In the illustrative embodiment wherein the horizontal extent is controllable by the operator, a magnification selection window start column (MagSelWinStartCol) 414 and a magnification selection window stop column (MagSelWinStopCol) 416 are determined. The start and stop columns 414, 416 are pixel location values for subsequent rendering by the rendering controller 204. The above values provided by the waveform analyzer 138 are time-based values. Accordingly, the selection window start and stop column calculations must convert time-based parameters to pixel values.

The magnification selection window start column 414 is determined by first dividing the difference of the beginning time of the selection window and the beginning time of the main view window by the total time represented by the main view window. The result of this calculation (a fraction between 0 and 1) is then multiplied by the total horizontal pixel range of the main view window. This gives a number of pixels which, when added to the pixel value representing the left hand edge of the main view window, yields the start column. In the illustrative embodiment illustrated in FIGS. 3B and 4, this would yield:

```
MagSelWinStartCol
    =   [((MagVWHorizDispOrig)-
[(MainVWHorizDispOrig))/(MainVWHorizDispRng)]*
        [(MainVWRightLimit) - (MainVWLeftLimit)] +
        MainVWLeftLimit
    =   [((-50ns) - (500ns))/1000ns)]*
        [((Pixel 609)- (Pixel 59)] + Pixel 59
    =   Pixel 307
```

The magnification selection window stop column 416 is determined in a similar manner. In the illustrative embodiment illustrated in FIGS. 3B and 4, this would yield:

```
MagSelWinStopCol
    =   [((MagVWHorizDispOrig) + (MagVWHorizDispOrg) -
        (MainVWHorizDispOrig))/(MainVWHorizDspRng)]*
        [(MainVWRightLimit) - (MainVWLeftLimit)] +
        MainVWLeftLimit
    =   [((-50ns) + (100ns) -(-500ns))/(1000ns)]*
        [((Pixel 609) - (Pixel 59)] +Pixel 59
    =   Pixel 362
```

The start and stop columns for the selection window are then provided to the rendering controller 204 a part of the selection window boundaries 252. As noted, the selection window start and stop rows may 417, 418 may also be calculated in a like manner and provided to the rendering controller 204 as part of the selection window boundaries 252.

It should be understood that in alternative embodiments, the calculations performed by the waveform analyzer 138 may be performed by the magnification selection window determinator 202. However, in the implementing digital oscilloscope 100, the waveform analyzer 138 currently performs such calculations. Accordingly, the results of those calculations are provided to the determinator 202 in the main/mag display parameters 250 as described above.

Figure 5:
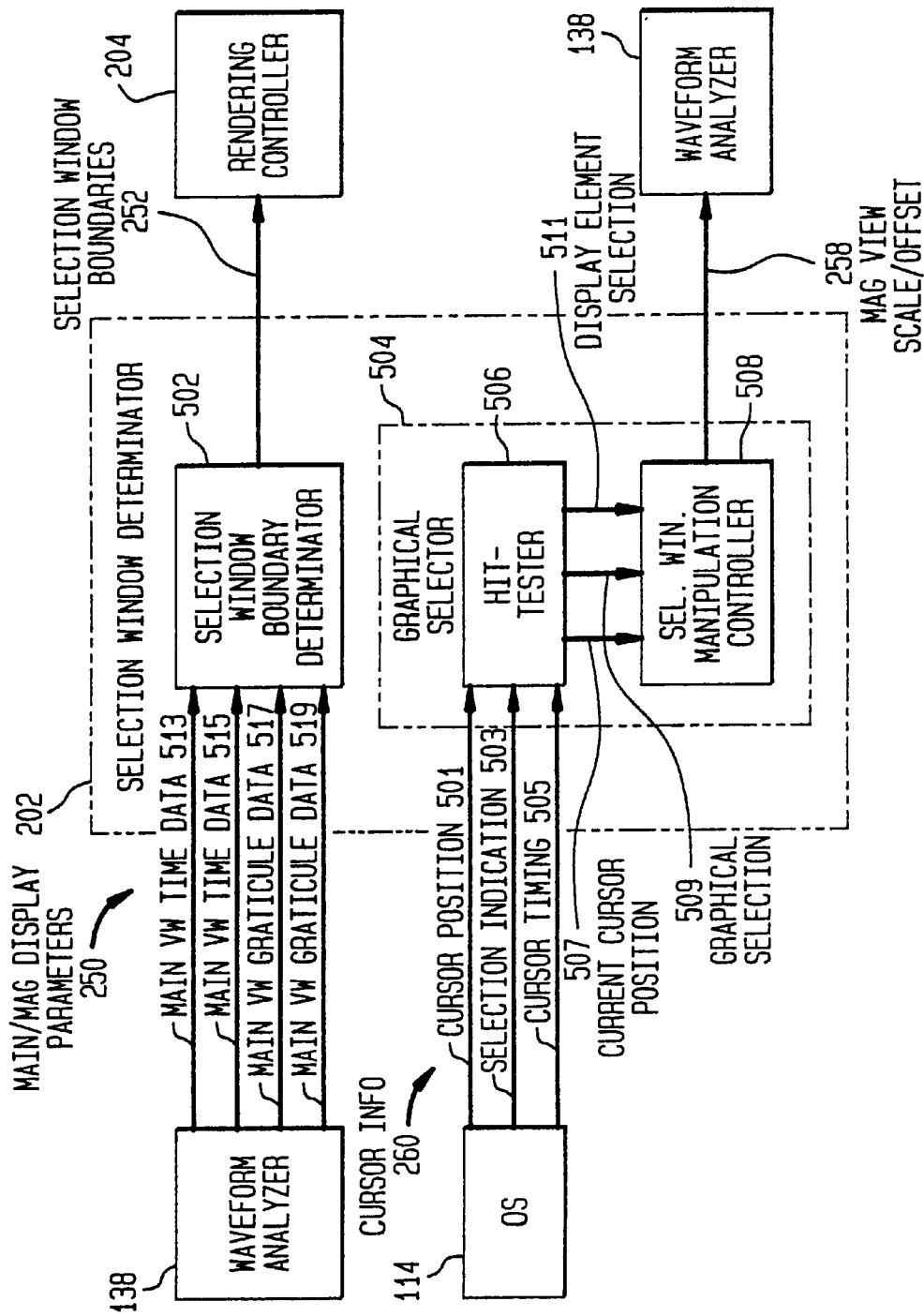
FIG. 5 is a functional block diagram of one embodiment of the selection window determinator illustrated in FIG. 2.

As noted, the selection window determinator 202 determines the selection window boundaries based upon the parameters 250 as described above. In the illustrative embodiment, the determinator 202 receives main and magnified display parameters 250 from the waveform analyzer 138 and uses these parameters to determine the selection window boundaries 252 defming the borders of the selection window 340 in terms of their pixel locations on the display 300 for subsequent rendering by the rendering controller 204. The determinator 202 also provides the operator with the ability to graphically manipulate the selection window 340 to encompass any desired region of the main waveform display 326. The determinator receives cursor information 260 from the operating system 114 and determines whether the selection window 340 has been selected by the operator using any available known pointing device. If the operator has graphically modified either the offset or scale of the selection window 340, the determinator 202 determines the magnified view window scale and offset values and provides them to the waveform analyzer 138 as shown by line 258. A functional block diagram of one embodiment of the selection window determinator 202 is illustrated in FIG. 5.

The selection determinator 202 broadly includes a selection window boundary determinator 502 and a graphical selector 504. The selection window boundary determinator 502 receives the main/mag display parameters 250 from the waveform analyzer 238 to generate the selection window boundaries 252 as described above. As noted, the display parameters 250 provided by the waveform analyzer 138 include time and graticule data for the main and magnified view windows.

The graphical selector 504 includes an interface with the digital oscilloscope 100 to obtain cursor information 260. As noted, the digital oscilloscope 100 is preferably a computer-based system containing computer system 101. Typically, in such embodiments, display control and status information such as cursor information 260 is obtained from the operating system 114 running on the processor 102 through the generation of well-known procedure calls.

The cursor information 260 includes a current position 501 of the cursor on the display 300 and a selection indication 503 indicating whether the operator has selected a pixel location on the display 300. The operator may select a pixel location through well-known pointing devices introduced above, such as a mouse, trackball, track-pad, joystick, keyboard, etc. The cursor information 260 also preferably includes cursor timing 505 which indicates the length of time during the which the cursor remains stationary, or dwells, at a single pixel location. A hit-tester 506 included in the graphical selector 504 determines whether a meaningful pixel location (such as within display 300) has been selected by the operator based upon these inputs in a well-known manner. Preferably, the hit tester 506 is the hit tester described in commonly-owned U.S. patent application Ser No. 08/863,461 entitled "System and Method for Efficient Hit-Testing in a Graphical User Interface," naming as an inventor Jay A. Alexander and filed on May 27, 1997, the specification of which is hereby incorporated by reference in its entirety.

The hit-test system determines 506 whether the operator has selected a cursor position sufficiently close to a display element to be considered a selection by the operator of that display element. As noted, a display element may include a waveform, vertical or horizontal markers, etc. The hit-tester 506 generates a display element selected output 511 to indicate such a selection. The hit-tester 506 also generates a graphical selection 509 indicating whether it has received a selection indication 503 from the operating system 104. Furthermore, the hit-tester 506 generates a current cursor position 507 based upon the cursor position 501 received from the operating system 114. It should be understood that the graphical selector 504 may include or interface with any other means for determining whether a meaningful pixel location has been selected by the operator based upon the above or other inputs and using other techniques now or later developed.

Figure 9:
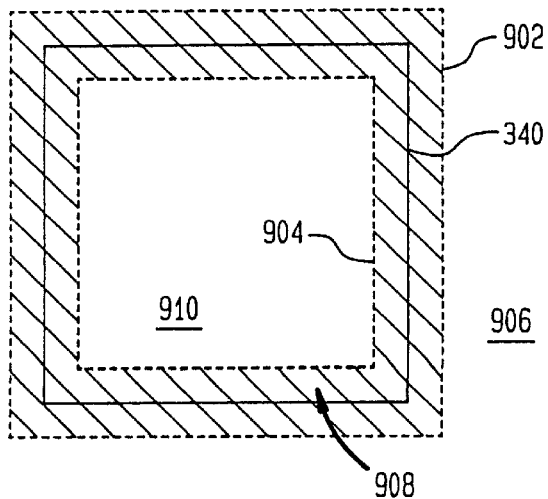
FIG. 9 is a perspective view of pixel regions created in accordance with one embodiment of the present invention to determine graphical selection of the selection window illustrated in FIGS. 3B–3E.

The graphical selector 504 also includes a selection window manipulation controller 508 for determining whether the operator selected the selection window 340. In one embodiment of the present invention, the controller 508 performs the following operations when the hit-tester 506 determines that a graphical selection has been made but that a display element has not been selected. Thus, such a selection indicates either that the operator has selected the background region or, possibly the selection window 340. The selection window 340 is determined to be selected if the cursor is at or adjacent to the selection window boundary. To determine whether the selection window 340 has been selected, the controller 508 divides the pixels in the display 300 into three regions. FIG. 9 is a perspective view of the selection window 340 and the pixel regions created by the controller 508 in accordance with one embodiment of the present invention. The three regions are defined by an outer boundary 902 and an inner boundary 904 surrounding the selection window 340. These two boundaries 902, 904 (which are internal data structures not displayed to the user) serve to divide the display area into three regions 906, 908 and 910. The controller 508 determines whether the current cursor position 507 is within each of the three defined regions 906, 908, 910. The controller 508 determines whether the operator has selected the selection window 340 and, if so, the type of operation that the operator is to perform. The operator may move the entire selection window 340 by dragging it across the display 300; that is, adjust the offset of the selection window 340. The operator may also change the size of the selection window 340 by selecting and dragging a border of the selection window 340 along the horizontal axis; that is, change the scaling of the selection window 340. If the current cursor position 507 is within region 906, then the selection window manipulation controller 508 determines that the operator has not selected the selection window 340. If the current cursor position 507 is within region 908, then the controller 508 determines that the operator has selected the selection window 340 with an intent to change the scaling or extent of the selection window 340. In this case, the selection window 340 is then resized based upon the final cursor location as indicated by the absence of the graphical selection indication 509. If the current cursor position 507 is within region 910, then the controller 508 determines that the operator intends to reposition or change the offset of the selection window 340. In this case, the entire selection window 340 is dragged to a different location on the main waveform display 326 identified by the current cursor position 507 at the time of the removal of the graphical selection indication 509. Alternatively, "resizing handles" as is commonly known in the art can be rendered on the selection window border such that when selected, a scaling operation may be performed. In this alternative, when other regions of the scaling window border are selected, a positioning operation is performed.

In one embodiment, the movement of the selection window 340 may be restricted to the top and bottom limits 401, 403 of the main graticule 322. In such an embodiment, the change in selection window position or size may be limited to the horizontal vector component of the cursor movement. As one skilled in the relevant art would find apparent, the change in scale and offset of the selection window 340 may be related to the graphical position of the cursor in any well-known manner. It should also be understood that the size and shape of these regions may be other than that illustrated in FIG. 9. For example, region 908 may be narrow, encompassing just a few pixels on opposing sides of the selection window boundary 340. Alternatively, the selection window boundary 340 may itself be rendered as a very narrow line to prevent obstruction or interference with the information presented on the main waveform display 326. In such a case, the region 908 may be configured to encompass a larger pixel area surrounding the selection window 340 to facilitate the operator's selection of the window boundary. These and other such variations are well-known in the art and considered to be within the scope of the present invention.

When the selection window 340 has been graphically modified by the operator, the selection window manipulation controller 508 converts the selection window size and location in terms of pixel location to a time-based scale and offset using the relationships described above. The resulting values are provided to the waveform analyzer 138 as is magnified view scale/offset data 258.

As noted, the rendering controller 204 controls the rendering of the main and magnification view windows 320, 330, as well as the rendering of the selection window 340. The rendering controller 204 also controls the rendering of the selected graphical display elements used to associate the magnification waveform display 336 with the selected main waveform display region 328. As noted, the rendering controller 204 receives the selection window boundaries 252 from the magnification selection window determinator 202 which include the pixel locations defining the boundary of the selection window 340. The rendering controller 204 also receives the graticule location and sizes 264 from the graphical user interface 116. As noted, the graticule information 264 is determined based upon the current graphic mode of the display 300. Based upon these inputs, the rendering controller 204 generates commands to the graphical user interface 116 to render the supporting windows 327 and 337 and any desired graphical association display elements or conditions. The rendering controller 204 also writes graticule rendering data 268 to the waveform RAM 142 to render the main and magnified graticules 322, 332 and backgrounds 324, 334. It should be understood that the rendering controller 204 may output rendering control information in any form or format necessary to render the windows and graticules in accordance with the present invention.

Figure 6:
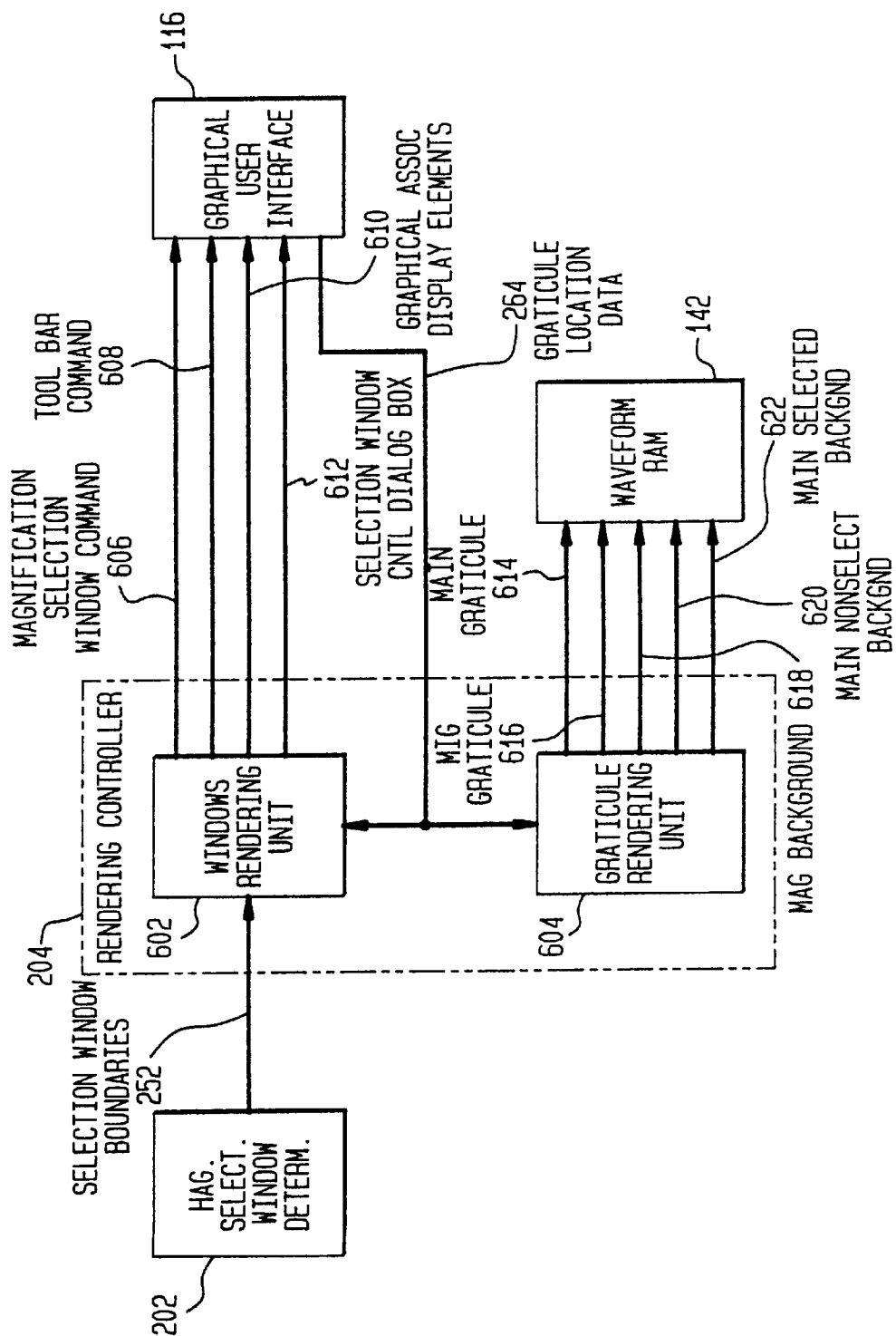
FIG. 6 is a functional block diagram of one embodiment of the rendering controller illustrated in FIG. 2.

FIG. 6 is a functional block diagram of one embodiment of the rendering controller 204. The rendering controller 204 broadly includes a windows rendering unit 602 and a graticule rendering unit 604. The windows rendering unit 602 receives the selection window boundaries 252 from the determinator 202. The windows rendering unit 602 also receives the graticule location and size data 264 from the graphical user interface 116. The windows rendering unit 602 generates various commands to the graphical user interface 116 to generate windows-related displays. The generation of such commands or procedure calls is considered to be well-known in the art.

In the illustrative embodiment illustrated in FIG. 6, the windows rendering unit 602 generates a magnification selection window command 606 to render the selection window 340. One or more toolbar commands 608 are generated to draw the main waveform display toolbar 350 and the magnified waveform display tool bar 360 as shown in FIGS. 3B–3E. One or more graphical association display elements 601 may also be generated by the windows rendering unit 606 in alternative embodiments to render graphical features, including additional graphical elements, which assist the operator in associating the magnified waveform display 336 and the selected waveform region 328. For example, the selection window 340 and magnified view supporting window 337 may be rendered in a particular color or shading to further assist in the association between the two regions. Furthermore, in an alternative embodiment, the windows rendering unit 602 generates one or more selection window control dialog boxes 612 to provide the operator with an additional or alternative means of adjusting the offset and scaling of the selection window 340. In such embodiments, selection of a pixel within regions 908 or 910 may invoke the display of such a dialog box. Alternatively, such a dialog box may be displayed in response to the selection of icons, menu items or other display elements.

The rendering controller 204 also includes the graticule rendering unit 604. The graticule rendering unit 604 renders the main graticule 322 and the magnified graticule 332 and their associated backgrounds 324, 334 and 342 based upon the graticule information 264 received from the graphical user interface 116. In the exemplary embodiment illustrated in FIG. 6, the graticule rendering unit 604 writes main graticule data 614 to the waveform RAM 142 to render the main graticule 322. The rendering unit 604 also writes magnification graticule data 616 to the waveform RAM 142 to render the magnification view graticule 332.

As noted, in the illustrative embodiment, the rendering controller 204 graphically associates the magnification waveform display 336 and the selected display region 328 by rendering the background of the graticules 322, 332. Accordingly, the rendering unit 604 writes main selected background data 622 directly into waveform RAM 142 to render the background region within the selection region 340 to a predetermined color or gray scale. Rendering unit 604 writes magnification background data 618 into waveform RAM 142 to render the background of the magnification waveform display 336 in the same color or gray scale as the selected region 328. The rendering unit 604 generates a main non-selected background data 620 to the waveform RAM 142 to render the background region of the main waveform display 326 in a color or gray scale to de-emphasize that portion of the main waveform display 326.

As one skilled in the relevant art would appreciate, the rendering controller 204 may output other information to the waveform RAM 142 or other component of the digital oscilloscope 100 to result in the rendering of display elements which graphically associate the magnified waveform display 336 and the selected region 328 of the main waveform display 326. For example, in one alternative embodiment, the main view window 320 does not include a main waveform display toolbar 350 providing some other means for the operator to graphically manipulate the scale and offset of the main waveform display 326. In such embodiments, the graphical display elements for associating the selected region 328 of the main waveform display 326 and the magnified waveform display 336 may include additional lines such as dashed lines, written so as to extend from the left and right edges of the bottom boundary of the selection window 340 and the top boundary of the magnified waveform display 336. As one skilled in the relevant art would find apparent, any other display element may be used to achieve the graphical association of the present invention.

Figure 7:
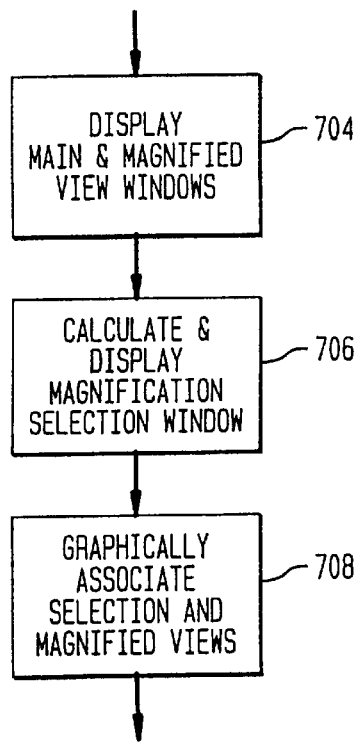
FIG. 7 is a high level flow chart of one embodiment of the processes performed in accordance with the present invention.

FIG. 7 is a high level flowchart of one embodiment of the processes performed by the waveform magnification system 118 of the present invention. The illustrated operations of the waveform magnification system 118 are performed when the system 118 is invoked. The waveform magnification system 118 may be invoked by the operator either through the front panel 108 or the graphical user interface 116 as shown in the invocation command 256 provided by both entities in FIG. 2. It is understood that there are many graphical techniques for enabling such an invocation. For example, an icon, pull-down menu, or other graphical technique may be used. In alternative embodiments, the waveform magnification system 118 may be invoked indirectly through operations occurring within the signal measurement system implementing the present invention. For example, upon automatic detection of specific conditions or occurrences, the system 118 may be invoked and the dual view display illustrated in FIG. 3B appears. Once invoked operations continue in block 704 wherein the main and magnified view windows are displayed. This includes the rendering of the main view window 320 including the main waveform display 326 and supporting window 327. Rendering of the main waveform display 326 includes the rendering of the main graticule 322. Likewise, the rendering of the magnified view window 330 includes the rendering of the magnified graticule 332 and supporting window 337. At block 706 the magnification selection window 340 is calculated. As discussed above, the location of the selection window 340 is based upon the scale, the horizontal and vertical scaling, an offset of the main and magnified waveform display 326, 336 as well as the size and location of the graticules 322, 332. As noted, the position of the selection window 340 is also dependent upon graphical manipulation commands provided by the operator to adjust the position and size of the selection window 340 in accordance with the present invention.

At block 708 the magnified waveform display 336 and the selected region 328 of the main, waveform display 326 are graphically associated with each other. This may be achieved in any known manner such as those described above. The waveform magnification system 118 may use any combination of windows or display systems to achieve a desired effect to assist the operator in associating the selected region and magnified view.

Figure 8A:
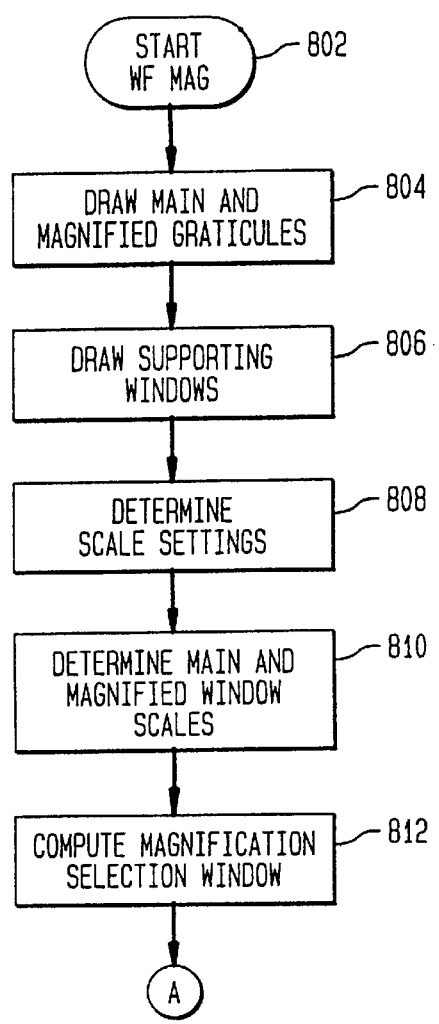
FIGS. 8A–8B comprise a flow chart of the processes performed in one embodiment of the present invention.
Figure 8B:
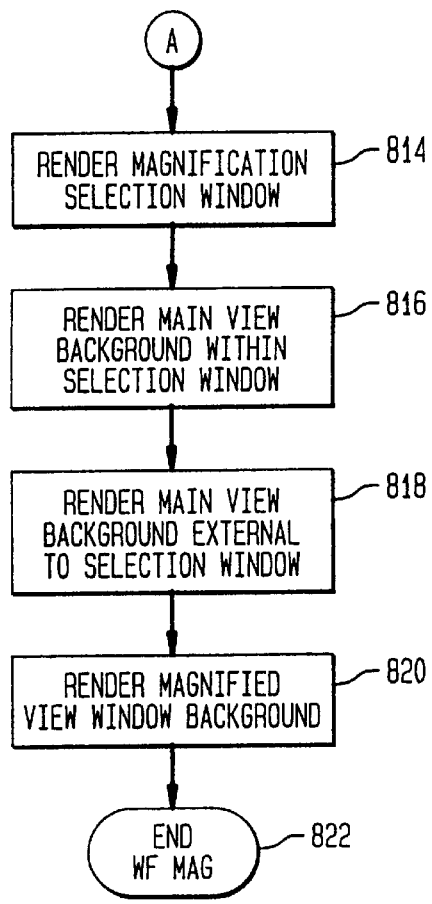

FIGS. 8A and 8B comprise a more detailed flowchart of one embodiment of the processes performed by the present invention. At start block 804, the waveform magnification process 800 is invoked in any manner described above. At block 804, the main and magnified graticules 322 and 332 are rendered on the display 300. As noted, the size of the graticule 322, 332 are based upon the current graphical mode. This may be determined by the rendering controller 204 or, as described above, determined by the graphical user interface 116. As discussed above, if the graphical user interface 116 determines the size of the graticules, then such information is be provided to the rendering controller 204 as graticule location data 264.

At block 806, the main view supporting window 327 and the magnified view supporting window 337 are rendered. This includes the rendering of the associated toolbars 350, 360 and any other display elements associated with the control and display of the information provided in their associated waveform displays 326, 336. The scale settings for the main and magnified view windows are determined in block 808. Here, the waveform analyzer 138 receives input 254, 262 and 258 indicating the current scale and offset control inputs for the magnified view window. Likewise, the waveform analyzer 138 receives inputs 259 and 260 identifying the scale and offset controls for the main view window.

From these inputs, the waveform magnification system 118 determines the main and magnified window scales at block 810. This includes determination of the main view window display range 402 and the main view horizontal display origin 412 and analogous values 420, 422 for the magnified view window. At block 812, the magnification selection window is computed based upon the parameters calculated at block 810. This results in the generation of the selection window boundaries 252 described above.

At block 814 the magnification selection window 340 is rendered. As noted, the selection window 340 is rendered in such a manner so as not to obstruct or interfere with the data provided in the main waveform display 326. Furthermore, the selection window 340 is rendered so as to be clearly visible to the operator. This facilitates the association between the selected region 328 and the magnified waveform display 336.

At blocks 816, 818 and 820 the background regions of the graticules are rendered. At block 816, the main view background within the selection window 340 is rendered. At block 818, the main view background external to the selection window is rendered. At block 820, the background of the magnified view window is rendered. In one embodiment, the contrast between the background and the waveforms is reduced communicating to the operator that these areas of the main waveform display 326 are de-emphasized relative to the information in the magnified region 328. Furthermore, the magnified region 328 of the main waveform display 326 and the magnified waveform display 336 are rendered so as to further assist in their association. In one embodiment, they are both rendered in a normal background color to reinforce the idea that the latter view is an expanded version of that portion of the main view 3. Processing then ends at block 822.

While various embodiments of the present invention have been described above, it should be understood that they have been presented by way of example only, and not limitation. For example, the waveform magnification system may be configured to receive control inputs, such as voice activation and control inputs. In such embodiments, voice activation commands may replace the graphical manipulation of a cursor to identify the various operator controlled values described above. Thus, the breadth and scope of the present invention should not be limited by any of the above-described exemplary embodiments, but should be defined only in accordance with the following claims and their equivalents.

What is claimed is:

1. An apparatus for use in a signal measurement system, said apparatus constructed and arranged to display simultaneously on a display of pixels a plurality of view windows comprising:

a main view window including a main waveform display adapted to have displayed therein one or more waveforms on a first graticule, and one or more main waveform control displays, displayed on said display of pixels, for enabling an operator to enter direct graphical inputs to adjust said main waveform display; and a magnified view window including a magnified waveform display adapted to have displayed therein a magnified view of a selected region of said main waveform display on a second graticule, said selected region being that portion of said main waveform display within a boundary of a selection window positioned over said main waveform display, and selection window control displays, displayed on said display of pixels, for enabling an operator to enter direct graphical inputs to adjust said selection window on said main waveform displays, wherein said selection window has a plurality of sides having resizing handles rendered thereon.

2. The apparatus of claim 1, wherein said selection window has a horizontal position that is adjustable through user graphical input applied to said selection window control display elements.

3. The apparatus of claim 1, wherein said selection window has a horizontal extent that is adjustable through user graphical input applied to said selection window control display elements.

4. The apparatus of claim 1, wherein said selection window has a vertical position that is graphically manipulatable.

5. The apparatus of claim 1, wherein said selection window has a vertical extent that is graphically manipulatable.

6. The apparatus of claim 1, further comprising:

a magnification selection window determinator constructed and arranged to determine horizontal and vertical scale and offset values of said magnified waveform display, said horizontal and vertical scale and offset values related to a position and extent of said selection window on said main waveform display.

7. The apparatus of claim 6, wherein said magnification selection window determinator comprises:

a selection window boundary determinator for determining pixel boundaries of said selection window on the display; and a graphical selector for enabling an operator to graphically manipulate said selection window.

8. The apparatus of claim 7, wherein said graphical selector comprises:

a selection window manipulation controller for determining whether the operator has graphically selected said selection window for changing either said position and said extent of said selection window.

9. The apparatus of claim 8, wherein said graphical selector further comprises:

a hit-tester for determining whether a display element has been graphically selected.

10. The apparatus of claim 8, wherein said selection window has a plurality of sides having resizing handles rendered thereon.

11. The apparatus of claim 10, wherein selection of a first resizing handle is interpreted as a scaling adjustment operation such that a subsequent change in a cursor position results in an analogous change in a display location of one or more of said plurality of selection window sides associated with said selected pixel.

12. The apparatus of claim 10, wherein selection of a second resizing handle is interpreted as an offset adjustment operation such that subsequent changes in a cursor position result in analogous changes in location of all of said plurality of selection window sides.

13. The apparatus of claim 6, further comprising:

a rendering controller constructed and arranged to control a rendering of said main waveform display, said magnification waveform display and said selection window based upon said horizontal and vertical scale and offset values.

14. The apparatus of claim 13, wherein said rendering controller is further constructed and arranged to control said rendering of said main waveform display, said magnification waveform display, and said selection window based upon a graphical mode of the display of pixels.

15. The apparatus of claim 13, wherein the signal measurement system further comprises a graphical user interface operationally coupled to the display and said apparatus, and wherein said rendering controller comprises:

a windows rendering unit configured to generate commands to the graphical user interface to generate windows-related displays based upon said selection window boundaries and locations and sizes of said main waveform graticule and said magnified waveform graticule; and a graticule rendering unit configured to generate commands to cause a rendering of said main waveform graticule and said magnified waveform graticule is based upon said locations and sizes of said main waveform graticule and said magnified waveform graticule.

16. The apparatus of claim 1 wherein said selected region of said main waveform display and said magnified waveform display have rendering characteristics that associate graphically said magnified waveform display and said selected region of said main waveform display.

17. The apparatus of claim 16, wherein said first graticule is rendered with a first background and said second graticule is rendered with a second background, and wherein said rendering characteristics is background color.

18. The apparatus of claim 17, wherein said first and second colors are gray scales.

19. The apparatus of claim 1, wherein said selection window has a plurality of sides, wherein graphical selection of a pixel within a predetermined region of pixels surrounding said selection window is interpreted as a scaling adjustment operation.

20. The apparatus of claim 19, wherein when a scaling adjustment operation has been detected, subsequent changes in a cursor position result in analogous changes in a display location of one or more of said plurality of selection window sides associated with said selected pixel.

21. The apparatus of claim 19,
wherein selection of a pixel within said selection window and not within said predetermined region of pixels is interpreted as a offset adjustment operation.

22. The apparatus of claim 21,
wherein when an offset adjustment operation has been detected, a subsequent change in a cursor position results in an analogous change in location of said selection window sides.

23. The apparatus of claim 1, wherein scale and offset values of said magnified waveform display are determined by a position of said selection window on said magnified waveform display, and wherein said graphical manipulation of said selection window effects a change in said scale and offset values of said magnified waveform display.

24. An apparatus, for use in a signal measurement system, constructed and arranged to display simultaneously on a display operationally coupled to the signal measurement system, a main waveform display adapted to have displayed therein one or more waveforms, and a magnified waveform display adapted to have displayed therein a magnified view of a selected region of said main waveform display,
wherein said selected region of said main waveform display and said magnified waveform display have rendering characteristics that graphically associate with each other said magnified waveform display and said selected region of said main waveform display,
wherein said rendering characteristics is background color.

25. The apparatus of claim 24, wherein the signal measurement system is a digital oscilloscope.

26. The apparatus of claim 24, wherein said selected region is defined by a selection window rendered over said main waveform display so as to surround said selected region.

27. The apparatus of claim 24,
wherein said main waveform display comprising a first graticule rendered with a first background, said first background including a first background region within said selected region that is rendered in a first color, and a second background region not within said selected region that is rendered in a second color not equal to said first color, and
wherein said magnified waveform display comprises a second graticule rendered with a second background rendered in said first color.

28. The apparatus of claim 24, wherein said selected region of said main waveform display is defined by a graphically-controllable selection window positioned over said main waveform display to encompass said selected region.

29. A method for magnifying a selected region of a main waveform display in a signal measuring system having a display device and a graphical user interface that controls a waveform display region on the display device, comprising the step of:
(a) displaying a main view window including a main waveform display adapted to have displayed therein one or more waveforms and associated data on a first graticule, and one or more main waveform control displays, displayed on said display device, for enabling an operator to adjust through direct graphical inputs horizontal scale and offset of said main waveform display; and
(b) displaying a magnified view window concurrently with said main view window, said magnified view window including a magnified waveform display adapted to have displayed therein a magnified view of selected region of said main waveform display displayed on a second graticule, said selected region being that portion of said main waveform display within a boundary of a selection window positioned over said main waveform display, and selection window control displays, displayed on said display device, for enabling an operator to adjust through direct graphical inputs a horizontal scale and offset of said selection window on said main waveform display; and
(c) graphically associating said magnified waveform display and said selected region of said main waveform display; wherein said step (c) comprises the step of:
(1) rendering a background of said main waveform graticules within said selection window in a first color;
(2) rendering a main waveform background not within said selection window in a second color not substantially the same as said first color; and
(3) rendering a background of said magnified view window in said first color.

30. The method of claim 29, wherein said step (a) comprises the steps of:
(1) rendering said first and second graticules on the waveform display region; and
(2) rendering a main view supporting window and a magnified view supporting window.

31. The method of claim 30, wherein said first and second graticules have a size based upon a current graphical mode of the waveform display region.

32. The method of claim 30, wherein said main view supporting window and said magnified view supporting window each include display elements associated with control and display of information provided in said associated waveform displays.

33. The method of claim 29, wherein said step (b) comprises the steps of:
(1) determining scale and offset settings for said main waveform display and said magnified waveform display;
(2) determining main and magnified window display ranges and said scale and offset values based upon said scale and offset settings and a graphical mode of the waveform display region;
(3) determining boundaries of said selection window; and
(4) rendering said selection window.

34. The method of claim 29, wherein said second color is rendered such that a contrast between said main waveform background and waveforms rendered in said main waveform display is reduced from a normal operational display.

35. An apparatus for use in a signal measurement system, said apparatus constructed and arranged to display simultaneously, on a display of pixels operationally coupled to the signal measurement system, a main waveform display comprising a first graticule rendered with a first background and a magnified waveform display comprising a second graticule rendered with a second background,
wherein said main waveform display is adapted to have displayed therein one or more waveforms, and said magnified waveform display is adapted to have displayed therein a magnified view of a selected region of said main waveform display,
wherein said selected region of said main waveform display is defined by a graphically-controllable selection window positioned over said main waveform display to encompass said selected region, said selection window having a size and a position on said main waveform display, and wherein scaling and offset of said magnified waveform display is configured to be altered by graphically manipulating said size of said selection window and said position of said selection window on said main waveform display, respectively wherein graphical selection of a pixel within a predetermined region of pixels surrounding said selection window is interpreted as a scaling adjustment operation.

36. The apparatus of claim 35, wherein graphical selection of a pixel within said selection window and not within said predetermined region of pixels invokes a selection window offset adjustment operation.

37. The apparatus of claim 36, wherein changes in a cursor position subsequent to said invocation of said scaling adjustment operation causes an analogous change in location of sides of selection window associated with the cursor position, while changes in a cursor position subsequent to said invocation of said offset adjustment operation causes an analogous change in position of all of said plurality of selection window sides.

38. The apparatus of claim 35, wherein said selection window has a plurality of sides having resizing handles rendered thereon, wherein selection of a first resizing handle is interpreted as a selection window scaling adjustment operation such that subsequent changes in a cursor position result in analogous changes in a display location of only one or more of said plurality of selection window sides associated with said selected pixel, and wherein selection of a second resizing handle is interpreted as a selection window offset adjustment operation such that subsequent changes in a cursor position result in analogous changes in location of all of said plurality of selection window sides.

39. The apparatus of claim 35, wherein said selected region and said magnified waveform display included rendering features that graphically associate said magnified waveform display and said selected region.

40. The apparatus of claim 39, wherein said rendering features that graphically associate said magnified waveform display and said selected region include background color of said region of said main waveform display encompassed by said selection window, background color of said main waveform display excluding said region encompassed by said selection window, and background color of said magnified waveform display.

41. An apparatus for use in a signal measurement system, said apparatus constructed and arranged to display simultaneously on a display of pixels a main waveform display and a magnified waveform display, wherein said main waveform display is adapted to have displayed therein one or more waveforms and associated data on a first graticule, and wherein said magnified waveform display is adapted to have displayed therein a magnified view of a selected region of said main waveform display on a second graticule, wherein said selected region of said main waveform display is defined by a graphically-controllable selection window positioned over said main waveform display to encompass said selected region wherein said first graticule is rendered with a first background and said second graticule is rendered with a second background, and wherein said first background includes a first background region within said selection window that is rendered in a first color, and a second background region not within said selection window is rendered in a second color not equal to said first color, and wherein said second background is rendered in said first color.

42. The apparatus of claim 41, further comprising:

a magnification selection window determinator constructed and arranged to determine horizontal and vertical scale and offset values of said magnified waveform display, said horizontal and vertical scale and offset values related to a position and extent of said selection window; and a rendering controller constructed and arranged to control a rendering of said main waveform display, said magnification waveform display and said selection window based upon said horizontal and vertical scale and offset values.

43. The apparatus of claim 42, wherein said rendering controller is further constructed and arranged to control said rendering of said main waveform display, said magnification waveform display, and said selection window based upon a graphical mode of the display of pixels.

44. The apparatus of claim 41, wherein said selected window of said main waveform display and said magnified waveform display include graphical elements that graphically associate said magnified waveform display and said selected region.

45. The apparatus of claim 41, wherein said selection window has a plurality of sides, wherein graphical selection of a pixel within a predetermined region of pixels surrounding said selection window is interpreted as a scaling adjustment operation.

46. The apparatus of claim 41, wherein said selection window has a plurality of sides having resizing handles rendered thereon.

47. The apparatus of claim 41, wherein scale and offset values of said magnified waveform display are determined by a position of said selection window on said magnified waveform display, and wherein said graphical manipulation of said selection window effects a change in said scale and offset values of said magnified waveform display.

48. An apparatus, for displaying concurrently on a display operationally coupled to a signal measurement system, a main waveform display adapted to have displayed therein one or more waveforms, and a magnified waveform display adapted to have displayed therein a magnified view of a selected region of said main waveform display, wherein said main waveform display and said magnified waveform display are rendered with graphical features that graphically associate with each other, wherein said main waveform display comprises a first graticule rendered with a first background that includes a first background region within said selected region that is rendered in a first color, and a second background region not within said selected region that is rendered in a second color different than said first color, and wherein said magnified waveform display comprises a second graticule rendered with a second background rendered in said first color.

49. The apparatus of claim 48, wherein the signal measurement system is a digital oscilloscope.

50. The apparatus of claim 48, wherein said selected region is defined by a selection window rendered over said main waveform display so as to surround said selected region.

51. The apparatus of claim 48, wherein said selected region of said main waveform display is defined by a graphically-controllable selection window positioned over said main waveform display to encompass said selected region.

52. A method for magnifying a selected region of a main waveform display in a signal measuring system having a display device and a graphical user interface that controls a waveform display region on the display device, comprising the steps of:

(a) displaying simultaneously a main waveform display and a magnified waveform display in said waveform display region, wherein said main waveform display includes a first graticule on which one more waveforms are displayed and said magnified waveform display includes a second graticule on which a magnified view of said selected region of said main waveform display is displayed;

(b) displaying a graphically controllable selection window over said main waveform, wherein said selection window encompasses said selected region of said main waveform display, the magnified view of which appears in said magnified waveform display; and (c) graphically associating said magnified waveform display and said selected region of said main waveform display, comprising the steps of:

(1) rendering a background of said main waveform graticule within said selection window in a first color;

(2) rendering a main waveform background not within said selection window in a second color not substantially the same as said first color; and (3) rendering a background of said magnified view window in said first color.

53. The method of claim 52, wherein said second color is rendered such that a contrast between said main waveform background and waveforms rendered in said main waveform display is reduced from a normal operational display.

54. The method of claim 52, wherein said step (a) comprises the steps of:

(1) rendering said first and second graticules on the waveform display region; and (2) rendering a main view supporting window and a magnified view supporting window.

55. The method of claim 52, wherein said step (b) comprises the steps of:

(1) determining scale and offset settings for said main waveform display and said magnified waveform display;

(2) determining main and magnified window display ranges and said scale and offset values based upon said scale and offset settings and a graphical mode of the waveform display region;

(3) determining boundaries of said selection window; and (4) rendering said selection window.

* * * * *